US008164101B2

(12) United States Patent
Morikawa et al.

(10) Patent No.: US 8,164,101 B2

(45) Date of Patent: Apr. 24, 2012

(54) LIGHT-EMITTING DEVICE, DISPLAY AND LIGHT-EMITTING METHOD

(75) Inventors: Takashi Morikawa, Kanagawa (JP); Kei Shimotani, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 1279 days.

(21) Appl. No.: 11/502,375

(22) Filed: Aug. 11, 2006

(65) Prior Publication Data

US 2007/0040179 A1 Feb. 22, 2007

(30) Foreign Application Priority Data

Aug. 18, 2005 (JP) ................................ 2005-237764
Apr. 4, 2006 (JP) ................................ 2006-102625

(51) Int. Cl.
*H01L 29/15* (2006.01)

(52) U.S. Cl. ........................................................ 257/78

(58) Field of Classification Search .......... 313/495–512; 502/150–153; 257/E21.276, E21.324, E21.275, 257/E21.546, 76

See application file for complete search history.

(56) References Cited

U.S. PATENT DOCUMENTS

| | | | | |
|---|---|---|---|---|
| 4,950,380 | A * | 8/1990 | Kurosawa et al. | 204/406 |
| 5,186,046 | A | 2/1993 | Gouterman et al. | |
| 5,341,676 | A | 8/1994 | Gouterman et al. | |
| 2004/0249593 | A1 * | 12/2004 | Dunleavy et al. | 702/98 |

FOREIGN PATENT DOCUMENTS

| | | |
|---|---|---|
| JP | A 07-12661 | 1/1995 |
| JP | A 2005-157096 | 6/2005 |

* cited by examiner

*Primary Examiner* — Karabi Guharay

*Assistant Examiner* — Elmito Breval

(74) *Attorney, Agent, or Firm* — Oliff & Berridge, PLC

(57) ABSTRACT

A light-emitting device includes a light-emitting portion and an oxygen concentration control portion. The light-emitting portion includes a surface. The light-emitting portion emits light with an intensity corresponding to an oxygen concentration on the surface when receiving light energy. The oxygen concentration control portion controls the oxygen concentration on the surface of the light-emitting portion.

15 Claims, 22 Drawing Sheets

(a)

(b)

(c)

*(a)*

*(b)*

LIGHT-EMITTING DEVICE, DISPLAY AND LIGHT-EMITTING METHOD

BACKGROUND

Technical Field

The present invention relates to a light-emitting device, a display apparatus and a light-emitting method using pressure-sensitive paint.

SUMMARY

According to an aspect of the invention, a light-emitting device includes a light-emitting portion and an oxygen concentration control portion. The light-emitting portion includes a surface. The light-emitting portion emits light with an intensity corresponding to an oxygen concentration on the surface when receiving light energy. The oxygen concentration control portion controls the oxygen concentration on the surface of the light-emitting portion.

BRIEF DESCRIPTION OF THE DRAWINGS

Exemplary embodiments of the invention will be described in detail based on the following figures, wherein.

DETAILED DESCRIPTION

[First Exemplary Embodiment]

(Configuration of Light-Emitting Device)

Figure 1A:
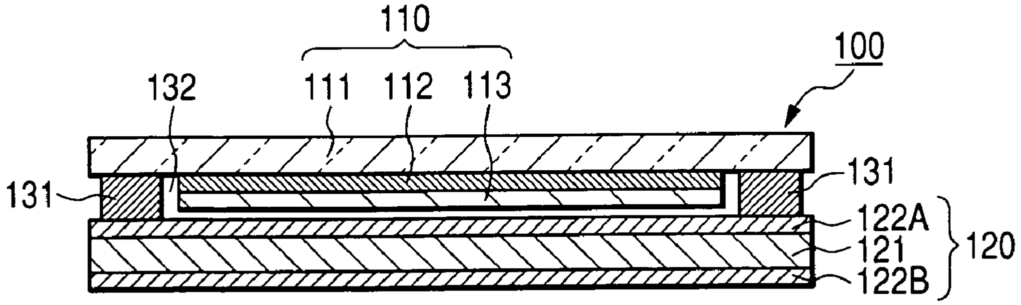
FIG. 1A is a sectional view of a light-emitting device according to a first exemplary embodiment of the invention.
Figure 1B:
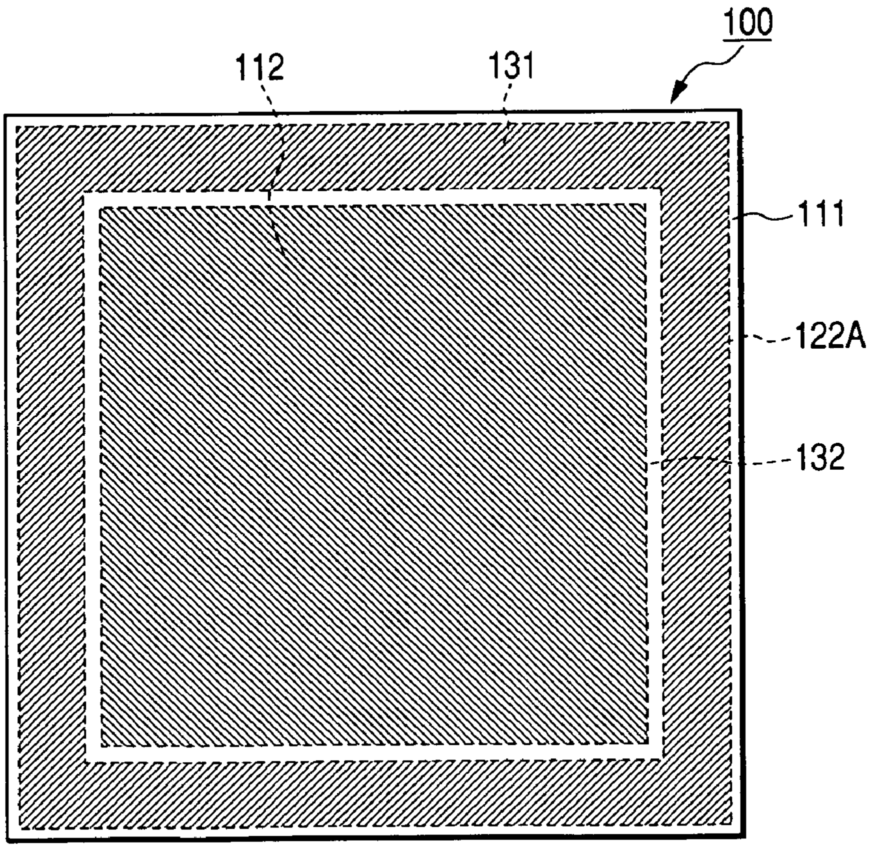
FIG. 1B is a top view of the light-emitting device according to the first exemplary embodiment of the invention.

FIGS. 1A and 1B are a sectional view and a top view of a light-emitting device according to a first exemplary embodiment of the invention.

The light-emitting device 100 is schematically configured so that a light-emitting portion 110 and an oxygen concentration control portion 120 are disposed opposite to each other while a spacer 131 is disposed therebetween. In this exemplary embodiment, the light-emitting portion 110, the oxygen concentration control portion 120 and the spacer 131 form a closed space 132 between the light-emitting portion 110 and the oxygen concentration control portion 120.

In this exemplary embodiment, the light-emitting portion 110 is formed in such a manner that an oxygen-sensitive light-emitting layer 112 made of pressure-sensitive paint or the like and a light reflecting layer 113 are successively disposed on a transparent substrate 111 made of glass or the like. The oxygen concentration control portion 120 is formed in such a manner that an oxygen ion conductor 121 is sandwiched between first and second electrodes 122A and 122B.

Although FIGS. 1A and 1B show the case where the light-emitting device 100 is shaped like a square, the shape of the light-emitting device 100 is not limited thereto. For example, the light-emitting device 100 may be shaped like a regular triangle or a regular hexagon.

The pressure-sensitive paint contains a luminous pigment and a binder for binding the luminous pigment to a surface of an object. Examples of the pigment used may include: a porphyrin compound such as PtOEP; a polycyclic aromatic compound such as Pyrene; a ruthenium complex such as Ru $(dpp)_3$; an iridium complex such as $Ir(dpp)_3$; and an europium complex such as $Eu(tta)_3phen$. The binder can be selected in accordance with the material of the pigment. Examples of the binder include: polymers such as polypropylene, polystyrene, low-density polyethylene, natural rubber and silicone rubber; and inorganic porous materials such as an aluminum oxide film and a silica gel plate.

The oxygen concentration control portion 120 includes the oxygen ion conductor 121, and the pair of electrodes 122A and 122B for applying a voltage to the oxygen ion conductor 121. Examples of the oxygen ion conductor 121 include: a zirconia solid electrolyte; stabilized zirconia doped with an impurity element such as Y, Sc, Ca, Mg, Ce, Al, Ti, Si, Fe or Hf; $CeO_2$ doped with Ca, Nd, etc.; and perovskite $BaCe_{1-x}Gd_xO_3$. Each of these examples of the oxygen ion conductor 121 can be used singly in the form of a thick film having a thickness in a range of 50 μm to 1 mm or can be used as a thin film formed on a porous alumina substrate. An electrically conductive material such as Pt, Au, Ag, $UScO_2$ and perovskite $La_{1-x}Sr_xCo_{1-y}Ni_yO_3$ can be used as each of the pair of electrodes 122A and 122B. Among these exemplary electrically conductive materials, Pt is preferable because Pt is stable against oxidation and reduction and can form a porous electrode. In addition, the oxygen concentration control portion 120 may be heated timely by a heater or the like in order to improve oxygen ion conductivity to increase the speed of response.

The spacer 131 may have a structure of a polygonal ring such as a triangular ring, a tetragonal ring or a hexagonal ring. The spacer 131 may be made of glass, ceramics or metal such as Ta, W, Ti, Al or duralumin.

The light-emitting portion 110 has the light reflecting layer 113 on the oxygen concentration control portion side of the oxygen-sensitive light-emitting layer 112. Examples of the light reflecting layer 110 include: a porous material such as white paint obtained by adding ethyl alcohol and titanium oxide particles to a polyvinyl butyral resin (PVB); and a mirror obtained by semi-transparent vapor deposition of metal such as Al on a transparent substrate, e.g. made of glass. The light reflecting layer 1113 can reflect light to thereby increase the brightness of the light-emitting device.

(Operation of Light-Emitting Device)

An example of operation of the light-emitting device will be described with reference to FIGS. 2A(a), 2A(b), FIG. 2B(c) and FIGS. 3A and 3B.

Figure 2A:
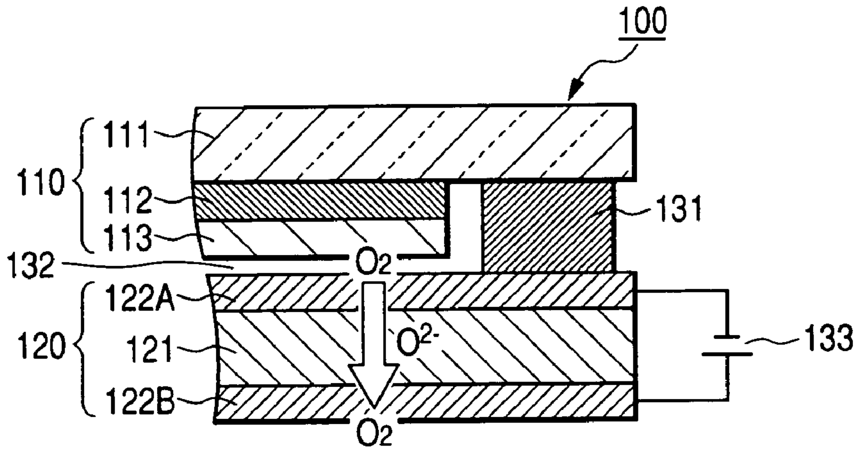
FIGS. 2A(a) and 2A(b) are sectional views showing a flow of operation of the light-emitting device according to the first exemplary embodiment of the invention.
Figure 2A:
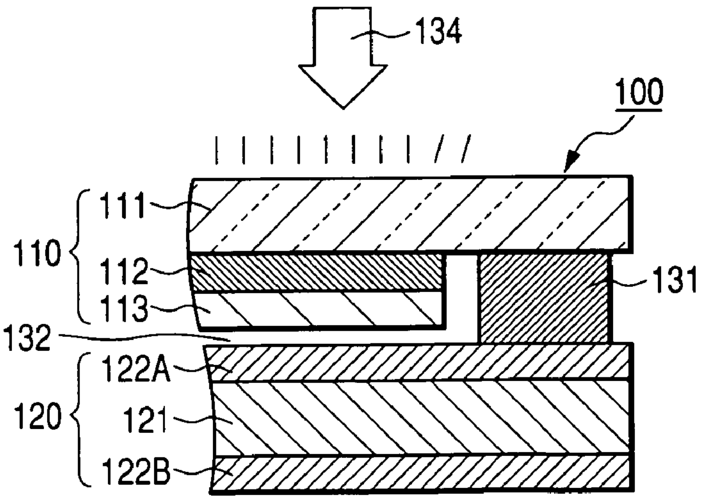
Figure 2B:
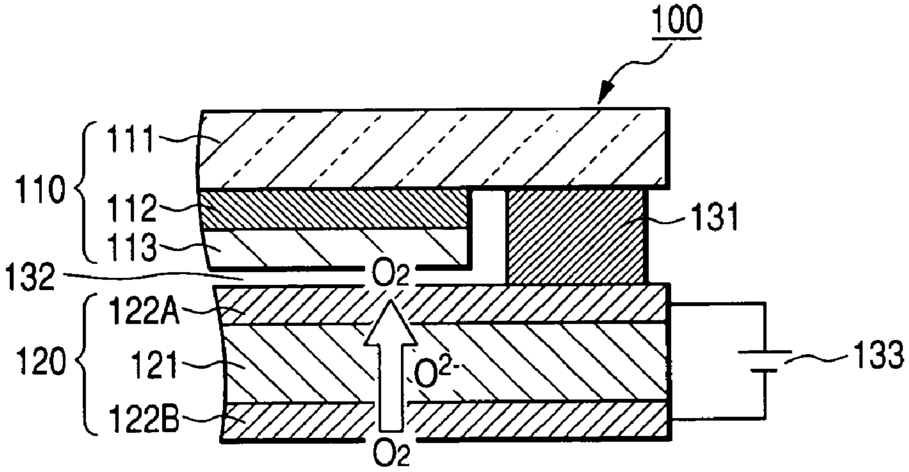
FIG. 2B(c)is a sectional views showing the flow of operation of the light-emitting device according to the first exemplary embodiment of the invention.
Figure 3A:
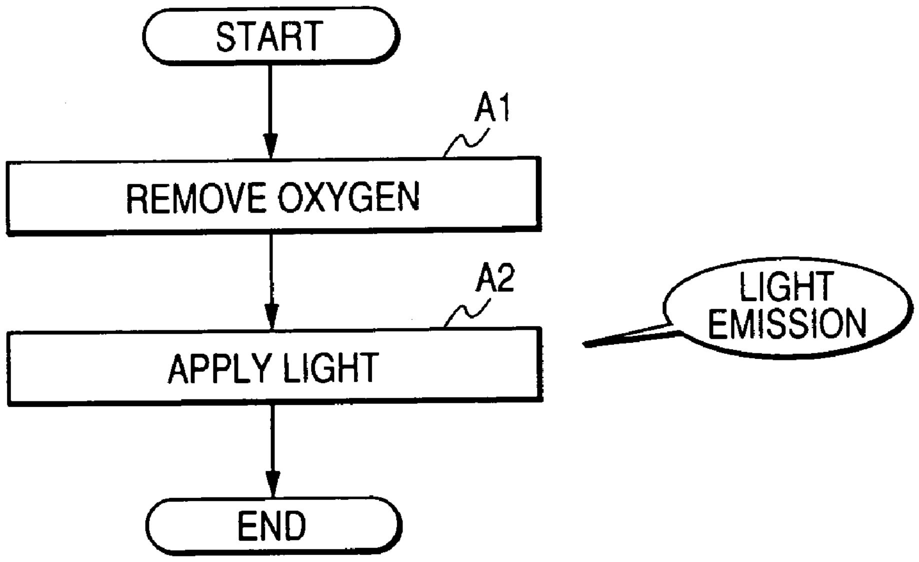
FIG. 3 is a flow chart of the operation of the light-emitting device according to the first exemplary embodiment of the invention.
Figure 3B:
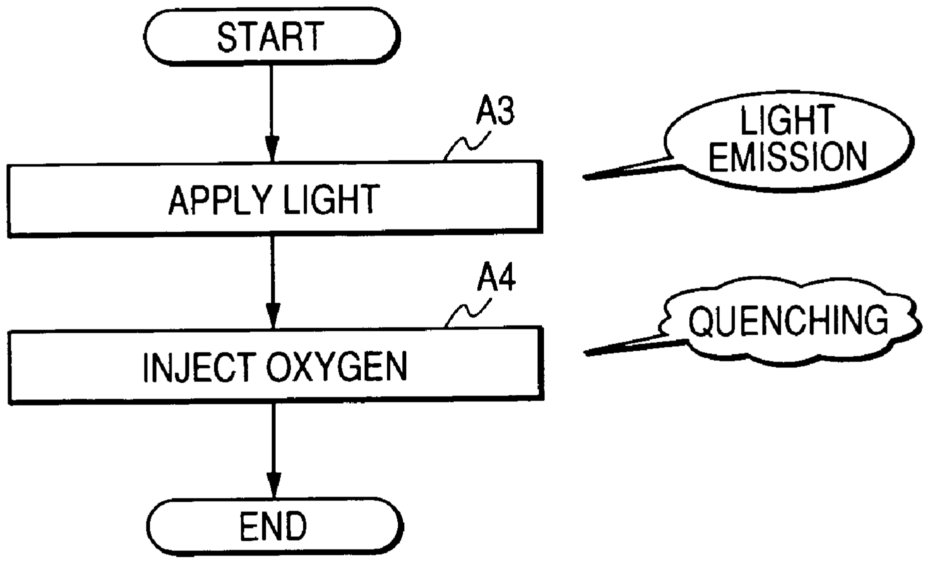

FIGS. 2A(a), 2A(b) and FIG. 2B(c) are sectional views showing a flow of operation of the light-emitting device 100 according to the first exemplary embodiment. FIGS. 3A and 3B is a flow chart of the operation of the light-emitting device 100.

First, when a voltage from a DC power supply 133 in a direction as shown in FIG. 2A(a) is applied between the first and second electrodes 122A and 122B at a predetermined temperature to supply a current to the plate-like oxygen ion conductor 121, oxygen ion conduction occurs so that oxygen in the closed space 132 passes through the oxygen ion conductor 121 as oxygen ions $O^{2-}$ and drains out of the light-emitting device 100 (Step A1 in FIG. 3). Here, the predetermined temperature is decided in accordance with the constituent material of the oxygen ion conductor 121. For example, in the case where the oxygen ion conductor 121 is made of a zirconia solid electrolyte, oxygen ion conductivity is improved when the oxygen ion conductor 121 is heated at a temperature of not lower than 350° C. In the case where the oxygen ion conductor 121 is made of perovskite $BaCe_{1-x}Gd_xO_3$, oxygen ion conductivity is improved when the oxygen ion conductor 121 is heated at a temperature of not lower than 300° C.

When the pigment in the oxygen-sensitive light-emitting layer 112 is excited by application of light 134 in the condition that oxygen is little in the closed space 132 as shown in FIG. 2A(b), light emission occurs because there is no excitation energy loss caused by the oxygen quenching effect (step A2 in FIG. 3).

When a voltage in a direction opposite to that in the step A1 is then applied between the first and second electrodes 122A and 122B at a predetermined temperature to supply a current to the oxygen ion conductor 121 in the condition that the oxygen-sensitive light-emitting layer 112 is emitting light as shown in FIG. 2B(c), oxygen ion conduction occurs so that oxygen is injected into the closed space 132 to cause quenching based on the oxygen quenching effect (step A4 in FIG. 3).

Incidentally, the sequence of the steps A1 and A2 in FIG. 3 may be reversed so that the oxygen concentration in the closed space 132 can be changed after the light-emitting device 100 is irradiated with light 134.

When the voltage applied to the oxygen ion conductor 121 and the voltage application time are controlled, the intensity of emitted light can be adjusted easily.

[Second Exemplary Embodiment]

(Configuration of Display Apparatus)

Figure 4A:
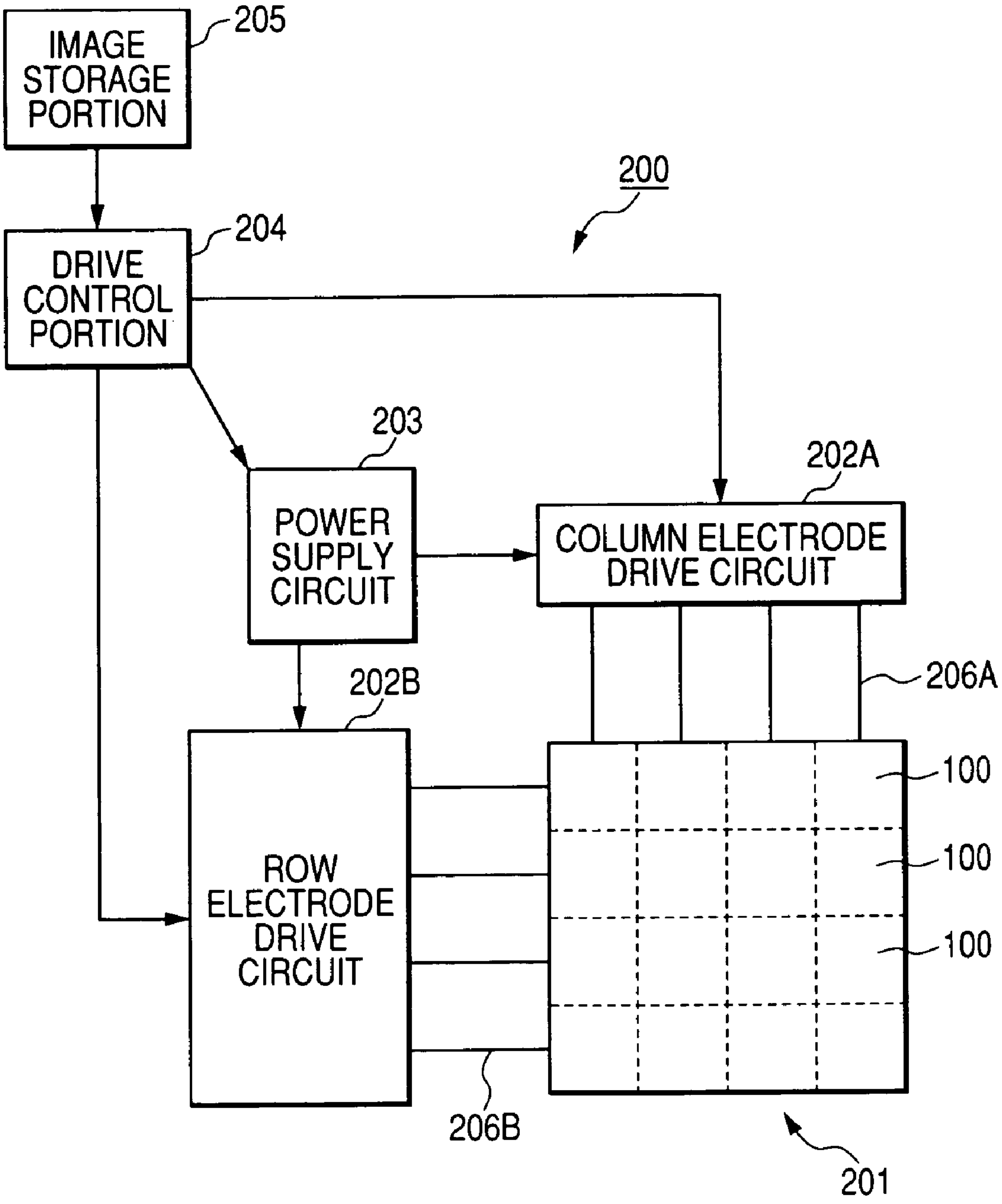
FIG. 4A is a top view showing the configuration of a display apparatus according to a second exemplary embodiment of the invention.

FIG. 4A is a top view showing the configuration of a display apparatus according to a second exemplary embodiment of the invention.

The display apparatus 200 is schematically configured so that the display apparatus 200 has an image display medium 201, a column electrode drive circuit 202A, a row electrode drive circuit 202B, a drive control portion 204, and a power supply circuit 203. The image display medium 201 includes an array of light-emitting devices 100. Each of the light-emitting devices 100 forms one pixel. The column electrode drive circuit 202A applies a voltage to each of the light-emitting devices 100 through corresponding one of column electrode lines 206A and corresponding one of first electrodes 122A. The row electrode drive circuit 202B applies a voltage to each of the light-emitting devices 100 through corresponding one of row electrode lines 206B and corresponding one of second electrodes 122B. The drive control portion 204 controls the column electrode drive circuit 202A and the row electrode drive circuit 202B to perform display control on the image display medium 201 based on image data stored in an image storage portion 205. The power supply circuit 203 supplies electric power to the column electrode drive circuit 202A and the row electrode drive circuit 202B.

Although FIG. 4A shows the case where the light-emitting devices 100 are arranged in the form of a 4×4 matrix, the shape of the array and the number of the light-emitting devices 100 are not limited thereto. When, for example, each of the light-emitting devices 100 is shaped like a polygon such as a regular hexagon, the array of light-emitting devices 100 may have a honeycomb structure.

Figure 4B:
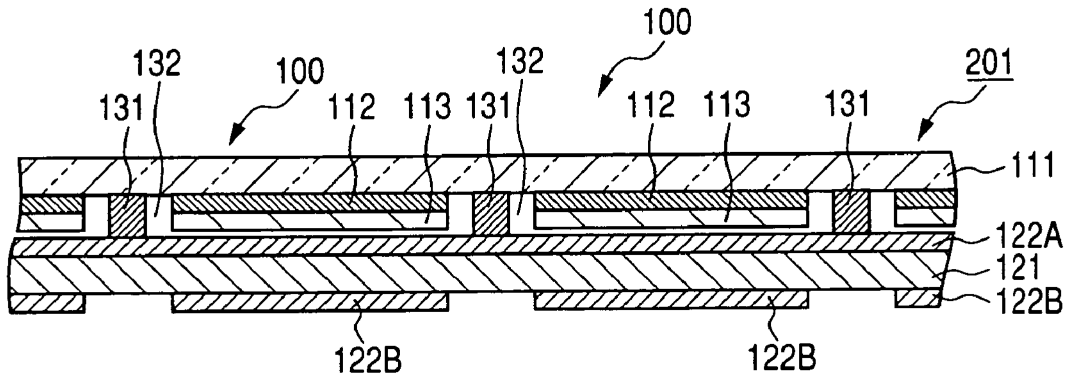
FIG. 4B is a sectional view of an image display medium according to the second exemplary embodiment of the invention.

FIG. 4B is a sectional view of the image display medium shown in FIG. 4A. This sectional view shows a section taken in a direction perpendicular to the row direction. The space in the light-emitting devices 100 is partitioned into closed spaces 132 by a spacer 131 so that each of the closed spaces 132 is kept airtight. Each column of the first electrodes 122A and each row of the second electrodes 122B are arranged so as to be perpendicular to each other with interposition of an oxygen ion conductor 121.

Figure 4C:
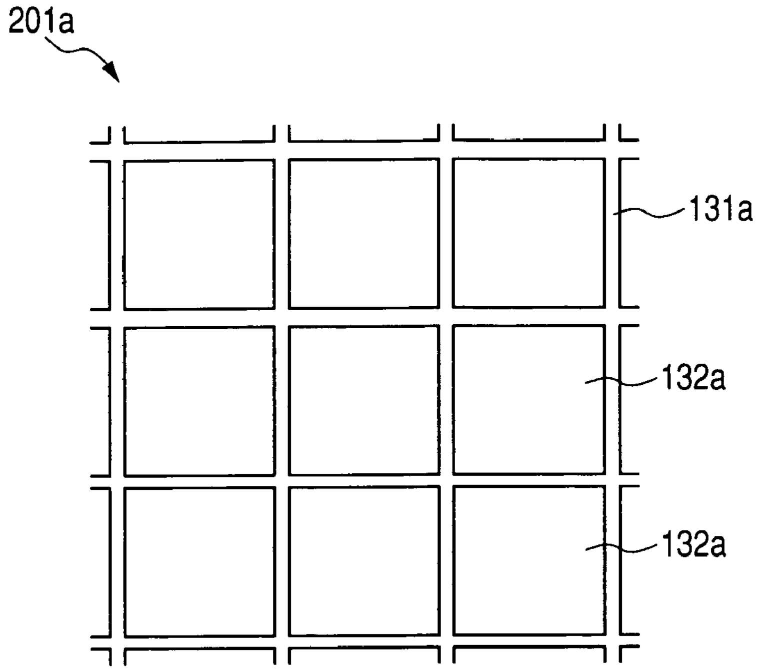
FIGS. 4C(a) and 4C(b) are top views showing examples of the shape of a spacer in an image display medium according to the second exemplary embodiment of the invention.
Figure 4C:
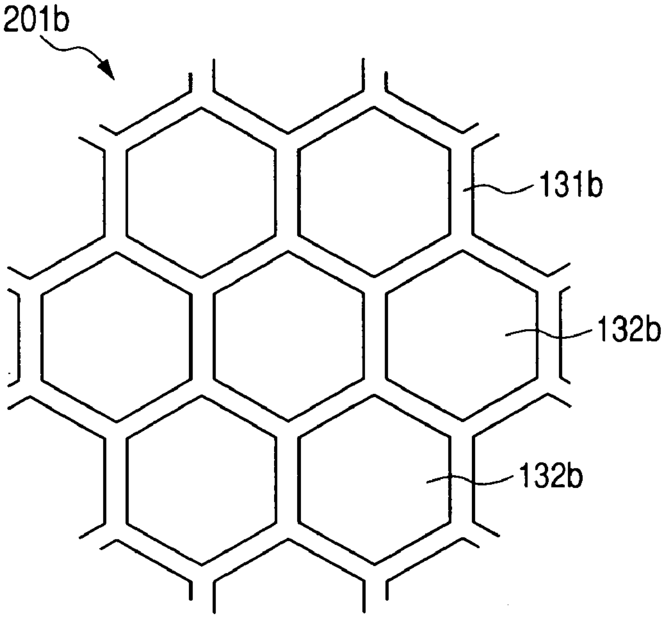

FIGS. 4C(a) and 4C(b) are top views showing examples of the shape of the spacer in the image display medium. In the image display medium 201*a* shown in FIG. 4C(a), the spacer 131*a* has a tetragonal lattice structure while the closed space 132*a* in each light-emitting device is shaped like a square. In the image display medium 201*b* shown in FIG. 4C(b), the spacer 131*b* has a honeycomb structure while the closed space 132*b* in each light-emitting device is shaped like a regular hexagon.

The drive control portion 204 is configured so that the drive control portion 204 includes a CPU, an ROM, an RAM, a timing signal generating circuit, etc. The CPU controls the row electrode drive circuit 202B, the column electrode drive circuit 202A and the power supply circuit 203 in accordance with a control program stored in the ROM to apply a voltage between the first and second electrodes 122A and 122B in light-emitting devices 100 corresponding to pixels based on the image data obtained from the image storage portion 205. Incidentally, the image storage portion 205 may input such image data through a recording medium such as a CD-ROM or a rewritable flash memory or through a network such as an LAN (Local Area Network).

Part or all of the column electrode drive circuit 202A, the row electrode drive circuit 202B, the power supply circuit 203, the drive control portion 204 and the image storage portion 205 may be provided as external devices which can be connected to the display apparatus 200.

The column electrode drive circuit 202A operates so that a voltage supplied from the power supply circuit 203 is applied to the corresponding first electrodes 122A based on a timing signal and an image signal from the drive control portion 204. On the other hand, the row electrode drive circuit 202B operates so that a voltage supplied from the power supply circuit 203 is applied to the corresponding second electrodes 122B based on the timing signal and the image signal from the drive control portion 204.

The first and second electrodes 122A and 122B are constituted by plural column electrodes and plural row electrodes which are perpendicular to each other and which are connected to the column electrodes 206A and the row electrodes 206B respectively, so that the respective pixels are driven by a passive matrix drive method. Alternatively, the first and second electrodes 122A and 122B may be constituted by a full-surface electrode and plural pixel electrodes while active devices such as TFTs are connected to points of intersection between plural data lines and plural scanning lines which are perpendicular to each other, so that the respective pixels are driven by an active matrix drive method.

(Operation of Display Apparatus)

An example of operation of the display apparatus will be described with reference to FIG. 5 and FIG. 6. Operation of each light-emitting device is the same as that in the first exemplary embodiment, so that description thereof will be omitted.

Figure 5:
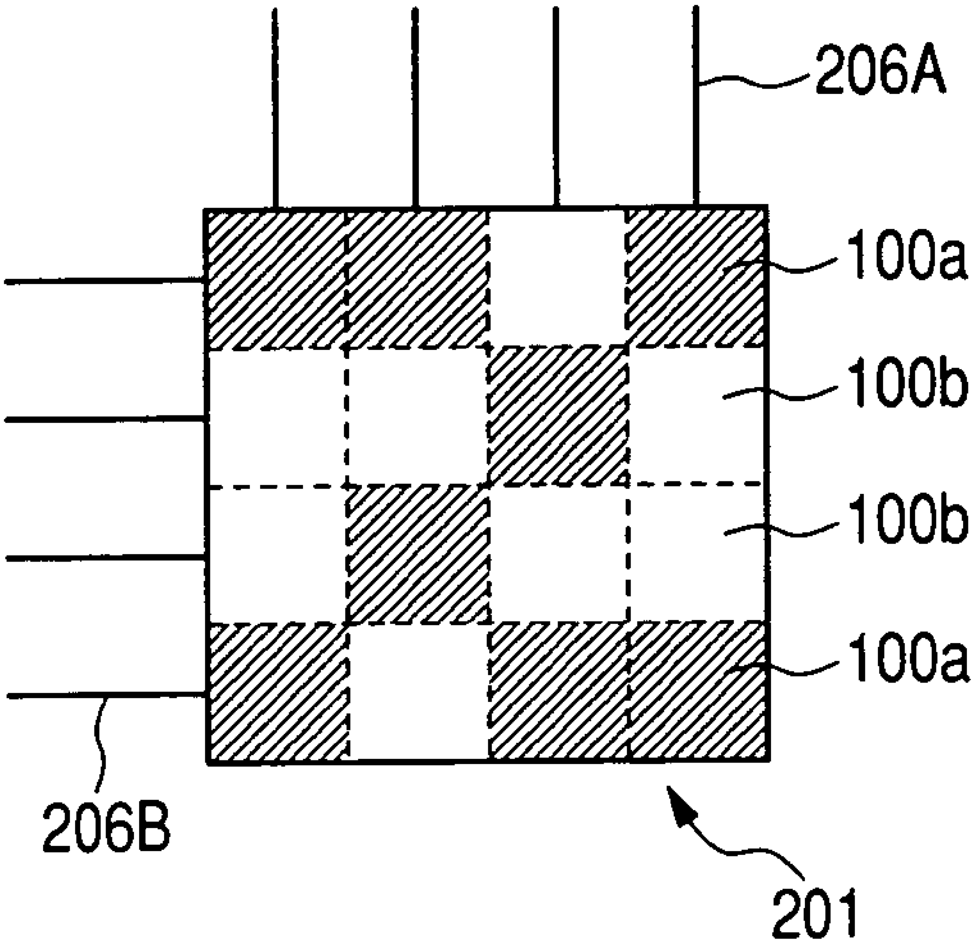
FIG. 5 is sectional views showing a flow of operation of the display apparatus according to the second exemplary embodiment of the invention.

FIG. 5 is sectional views showing a flow of operation of the display apparatus 200 according to the second exemplary embodiment. FIG. 6 is a flow chart of the operation of the display apparatus 200.

Figure 6:
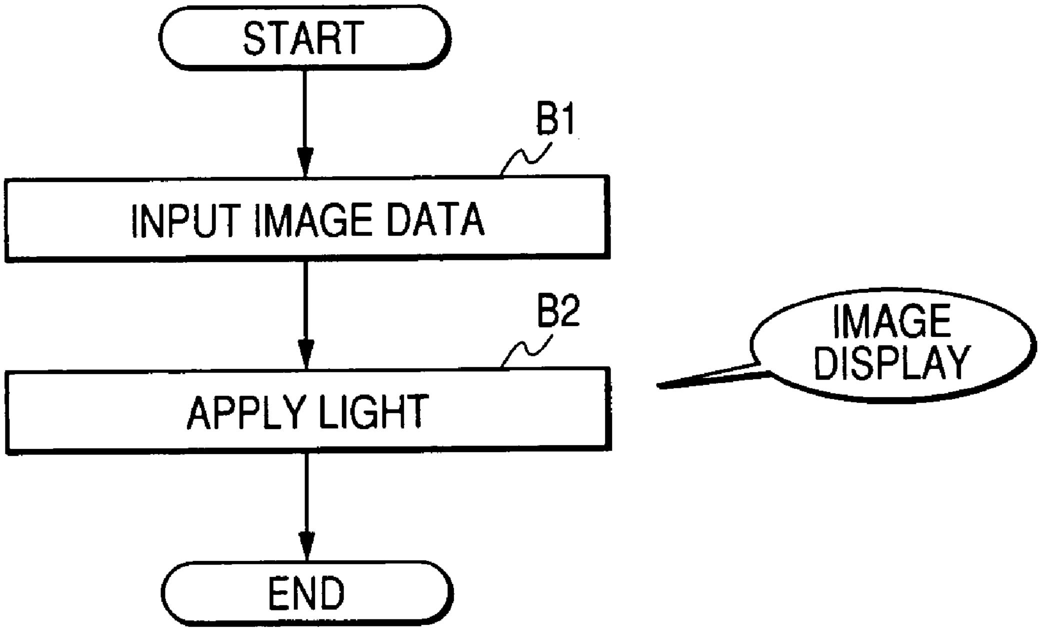
FIG. 6 is a flow chart of the operation of the display apparatus according to the second exemplary embodiment of the invention.

First, the drive control portion 204 controls the column electrode drive circuit 202A and the row electrode drive circuit 202B to perform display control on the image display medium 201 based on image data stored in the image storage portion 205 (step B1 in FIG. 6).

When the column electrode drive circuit 202A applies a voltage to the oxygen ion conductors 121 of the light-emitting devices through the column electrode lines 206A and the first electrodes 122A under a predetermined temperature while the row electrode drive circuit 202B applies a voltage to the oxygen ion conductors 121 of the light-emitting devices through the row electrode lines 206B and the second electrodes 122B likewise, the oxygen concentrations in the closed spaces 132 of the light-emitting devices 100 are controlled based on the input image data.

When the image display medium 201 is then irradiated with light 134, a pigment in the oxygen-sensitive light-emitting layer 112 of each light-emitting device 100 is excited so that the light-emitting device 100 having a low oxygen concentration in the closed space 132 emits light. As a result, an image based on the input image data is displayed on the image display medium 201 as shown in FIG. 5 (step B2 in FIG. 6) irradiation of the light is stopped.

When a voltage applied to the oxygen ion conductor 121 of each light-emitting device 100 is controlled, an image with gradations can be displayed.

[Third Exemplary Embodiment]

(Configuration of Light-Emitting Device)

Figure 7A:
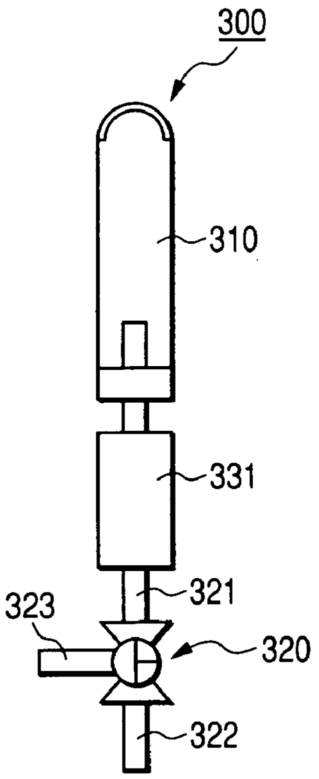
FIG. 7A is a view of the configuration of a light-emitting device according to a third exemplary embodiment of the invention.
Figure 7B:
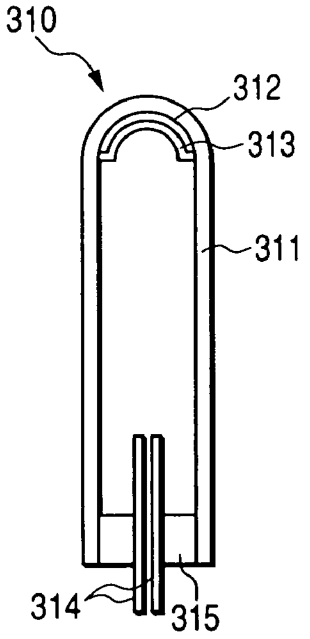
FIG. 7B is an enlarged sectional view of a light-emitting portion of the light-emitting device.

FIG. 7A is a configuration view of a light-emitting device according to a third exemplary embodiment of the invention. FIG. 7B is an enlarged sectional view of a light-emitting portion of the light-emitting device.

The light-emitting device 300 is schematically configured in such a manner that a light-emitting portion 310 is connected to a vacuum pump not shown and a three-way valve 320 through a pressure-resistant tube 331. The vacuum pump and the three-way valve 320 serve as an oxygen concentration control portion. Examples of the three-way valve 320 include a three-way electromagnetic valve, and a three-way cock.

In this exemplary embodiment, the light-emitting portion 310 is formed in such a manner that an oxygen-sensitive light-emitting layer 312 made of pressure-sensitive paint or the like and a light reflecting layer 313 are formed successively in the bottom of a test tube 311 made of glass or the like. An opening of the test tube 311 is blocked with a cap 315. Air in the test tube 311 can be connected to the outside only through an air pipe 314 made of glass or the like. In addition, the three-way valve 320 has a light-emitting portion joint 321 connected to the light-emitting portion 310, a vacuum pump joint 322 connected to the vacuum pump, and an air inlet 323 through which air can be taken in.

(Operation of Light-Emitting Device)

An example of operation of the light-emitting device will be described with reference to FIG. 8 which is a flow chart of the operation.

First, in the condition that the light-emitting portion joint 321 and the vacuum pump joint 322 are connected to each other in the three-way valve 320, the air inlet 323 is closed to connect the light-emitting portion 310 to the vacuum pump to thereby evacuate air from the light-emitting portion 310 (step C1 in FIG. 8A).

Figure 8:
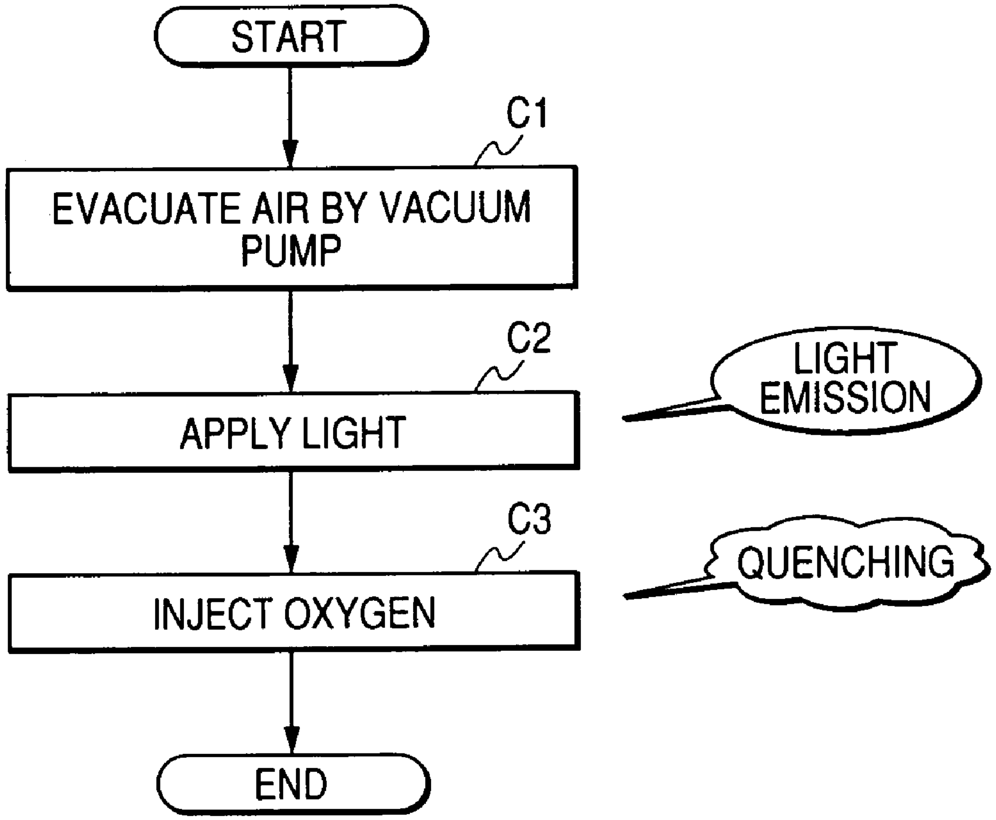
FIG. 8 is a flow chart of an example of operation of the light-emitting device according to the third exemplary embodiment of the invention.

When light is then applied to the oxygen-sensitive light-emitting layer 312 to excite a pigment in the oxygen-sensitive light-emitting layer 312 in the condition that oxygen little remains in the light-emitting portion 310 because of the evacuation of air, light emission occurs because there is no excitation energy loss caused by the oxygen quenching effect (step C2 in FIG. 8).

Then, in the condition that the oxygen-sensitive light-emitting layer 312 is emitting light, the light-emitting portion joint 321 and the air inlet 323 are connected to each other in the three-way valve 320 while the vacuum pump joint 322 is closed. When air is taken in the light-emitting portion 310 in this manner, quenching occurs due to the oxygen quenching effect (step C3 in FIG. 8).

Incidentally, the sequence of the steps C1 and C2 in FIG. 8 may be reversed so that the oxygen concentration in the light-emitting portion 310 can be changed after the light-emitting device 300 is irradiated with light.

Plural light-emitting devices according to the third exemplary embodiment can be arranged for forming an image display apparatus.

[Fourth Exemplary Embodiment]

(Configuration of Light-Emitting Device)

Figure 9A:
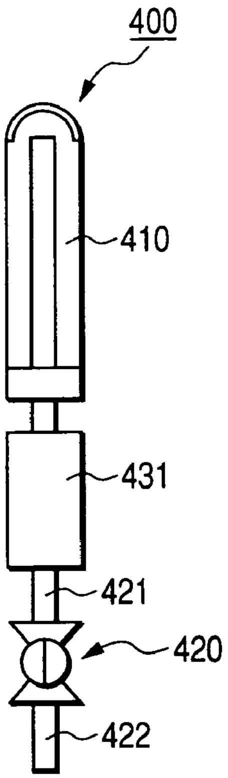
FIG. 9A is a view of the configuration of a light-emitting device according to a fourth exemplary embodiment of the invention.
Figure 9B:
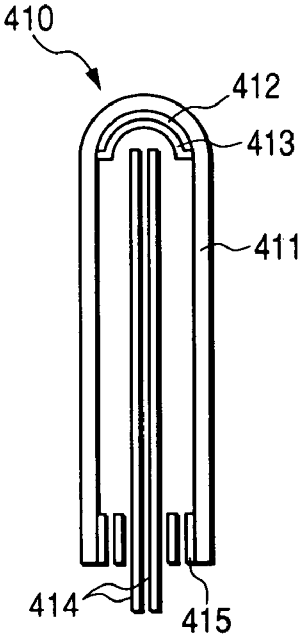
FIG. 9B is an enlarged sectional view of a light-emitting portion of the light-emitting device.

FIG. 9A is a configuration view of a light-emitting device according to a fourth exemplary embodiment of the invention. FIG. 9B is an enlarged sectional view of a light-emitting portion of the light-emitting device.

The light-emitting device 400 is schematically configured so that a light-emitting portion 410 is connected to a nitrogen cylinder not shown and a two-way valve 420 through a tube 431. The nitrogen cylinder and the two-way valve 420 serve as an oxygen concentration control portion. Examples of the two-way valve 420 include a two-way electromagnetic valve, and a two-way cock.

The configuration of the light-emitting portion 410 in the embodiment is different from the light-emitting portion 310 according to the third exemplary embodiment in that a cap in an opening portion of a test tube 411 is a perforated cap 415 so that air can be evacuated from the light-emitting portion 410 through perforations of the perforated cap 415. In addition, the two-way valve 420 has a light-emitting portion joint 421 connected to the light-emitting portion 410, and a nitrogen cylinder joint 422 connected to the nitrogen cylinder.

(Operation of Light-Emitting Device)

An example of operation of the light-emitting device will be described with reference to FIG. 10 which is a flow chart of the operation.

Figure 10:
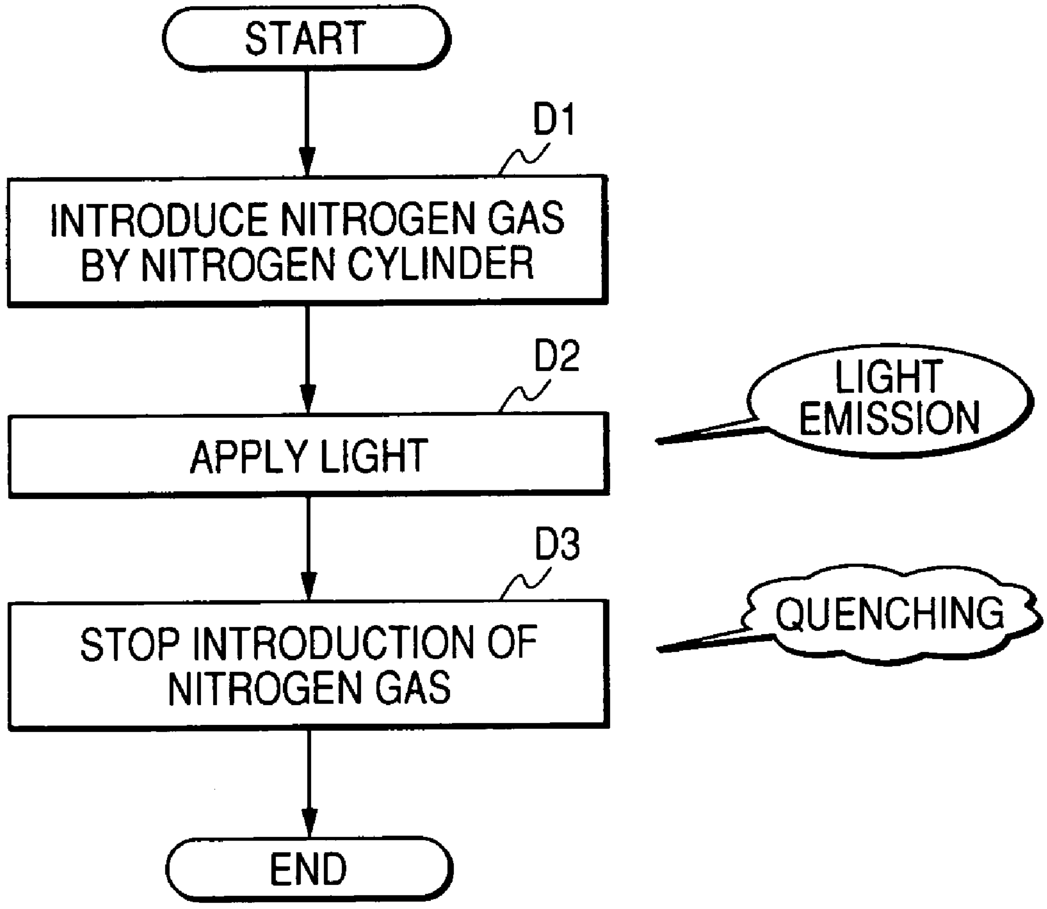
FIG. 10 is a flow chart of an example of operation of the light-emitting device according to the fourth exemplary embodiment of the invention.

First, in the condition that the light-emitting portion joint 421 and the nitrogen cylinder joint 422 are connected to each other in the two-way valve 420, the light-emitting portion 410 is connected to the nitrogen cylinder so that nitrogen gas is introduced into the light-emitting portion 410 while oxygen is evacuated from the light-emitting portion 410 through the perforations of the perforated cap 415 (step D1 in FIG. 10).

When light is then applied to an oxygen-sensitive light-emitting layer 412 to excite a pigment in the oxygen-sensitive light-emitting layer 412 in the condition that there is little oxygen remaining in the light-emitting portion 410 because of evacuation of air from the light-emitting portion 410, light emission occurs because there is no excitation energy loss caused by the oxygen quenching effect (step D2 in FIG. 10).

Then, in the condition that the oxygen-sensitive light-emitting layer 412 is emitting light, connection between the light-emitting portion joint 421 and the nitrogen cylinder joint 422 in the two-way valve 420 is disabled. When oxygen is diffused into the light-emitting portion 410 through the perforations of the perforated cap 415 in this manner, quenching occurs due to the oxygen quenching effect (step D3 in FIG. 10).

Incidentally, the sequence of the steps D1 and D2 in FIG. 10 may be reversed so that the oxygen concentration in the light-emitting portion 410 can be changed after the light-emitting device 400 is irradiated with light.

(Effect of Fourth Exemplary Embodiment)

According to the fourth exemplary embodiment, a nitrogen cylinder and a two-way valve 420 can be used as an oxygen concentration control portion for producing an oxygen-sensitive type light-emitting device.

Plural light-emitting devices according to the fourth exemplary embodiment can be arranged for forming an image display apparatus.

[Fifth Exemplary Embodiment]

(Configuration of Light-Emitting Device)

Figure 11A:
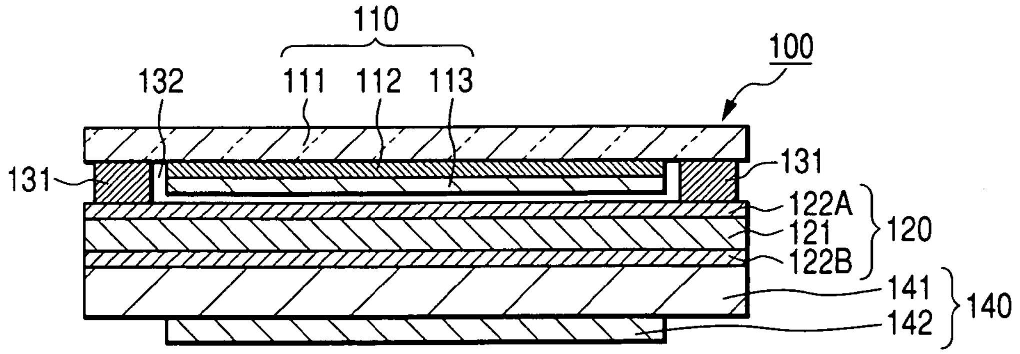
FIG. 11A is a sectional view of a light-emitting device according to a fifth exemplary embodiment of the invention.
Figure 11B:
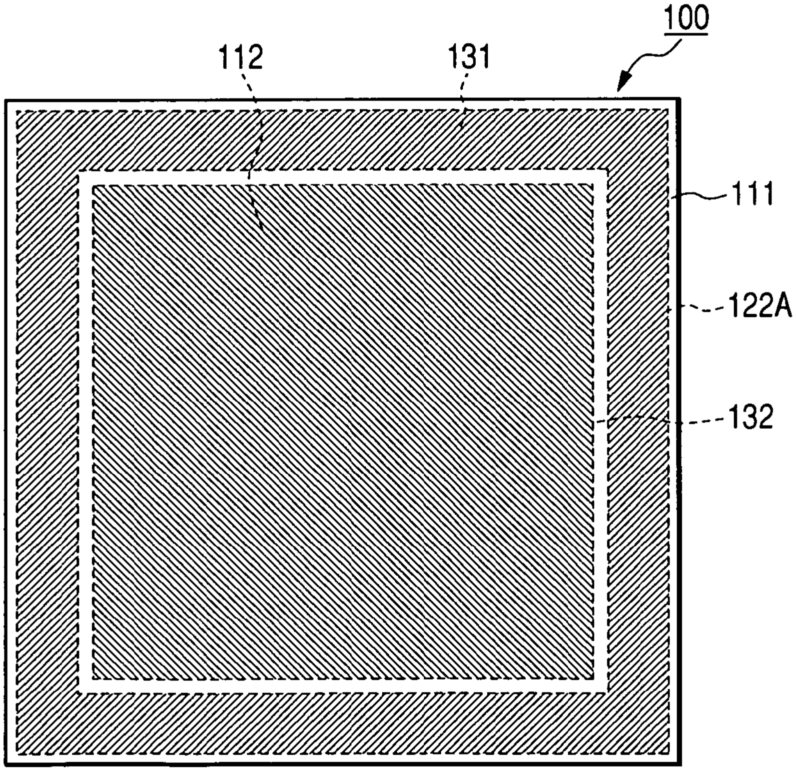
FIG. 11B is a top view of the light-emitting device according to the fifth exemplary embodiment of the invention.

FIGS. 11A and 11B are a sectional view and a top view of a light-emitting device according to a fifth exemplary embodiment of the invention, respectively.

As shown in FIGS. 11A and 11B, the light-emitting device 100 is schematically configured so that a light-emitting portion 110 and an oxygen concentration control portion 120 are disposed opposite to each other with interposition of a spacer 131. In addition, the light-emitting device 100 includes a heating portion 140 for heating an oxygen ion conductor 121 of the oxygen concentration control portion 120. In this exemplary embodiment, both the light-emitting portion 110 and the oxygen concentration control portion 120 are formed to be substantially flat. The light-emitting portion 110 and the oxygen concentration control portion 120 are separated from each other with interposition of the spacer 131. The light-emitting portion 110, the oxygen concentration control portion 120 and the spacer 131 form a closed space 132 between the light-emitting portion 110 and the oxygen concentration control portion 120.

In this exemplary embodiment, the light-emitting portion 110 is formed in such a manner that an oxygen-sensitive light-emitting layer 112 and a light reflecting layer 113 are successively disposed on a transparent substrate 111. The transparent substrate 111 is made of glass or the like. The oxygen-sensitive light-emitting layer 112 is made of pressure-sensitive paint or the like. The surface of the transparent substrate 111 on which the oxygen-sensitive light-emitting layer 112 and the light reflecting layer 113 are laminated faces the oxygen concentration control portion 120.

In addition, the oxygen concentration control portion 120 is formed in such a manner that the oxygen ion conductor 121 is sandwiched between first and second electrodes 122A and 122B. The first and second electrodes 122A and 122B are full-surface electrodes each of which is provided as a flat plate shaped like a square with an equal area in top view. The first electrode 122A faces the light-emitting portion 110.

As shown in FIG. 11B, each of the oxygen-sensitive light-emitting layer 112 and the light reflecting layer 113 is shaped like a square. The spacer 131 is formed to surround the oxygen-sensitive light-emitting layer 112 and the light reflecting layer 113 at a predetermined distance. The spacer 131 abuts on the transparent substrate 111 and the first electrode 122A to thereby form the closed space 132. That is, the spacer 131 serving as a partition member partitions and closes the space between the transparent substrate 111 and the oxygen ion conductor 121.

The heating portion 140 is a ceramic heater which includes a ceramic substrate 141, and a heater element 142 formed on the surface or in the inside of the ceramic substrate 141. In addition, the heating portion 140 is shaped like a square substantially the same in shape as the oxygen concentration control portion 120 in plan view. In this exemplary embodiment, the ceramic substrate 141 is a porous alumina substrate, and the heater element 142 is a thin-film heater. The ceramic substrate 141 is brought into contact with a surface of the second electrode 122B opposite to a surface thereof on which the oxygen ion conductor 121 is formed. The heater element 142 is disposed in a surface of the ceramic substrate 141 opposite to a surface thereof on which the second electrode 122B is formed.

Although FIGS. 11A and 11B show the case where the light-emitting device 100 is shaped like a square, the shape of the light-emitting device 100 is not limited thereto. For example, the light-emitting device 100 may be shaped like a regular triangle or a regular hexagon.

(Operation of Light-Emitting Device)

Figure 12:
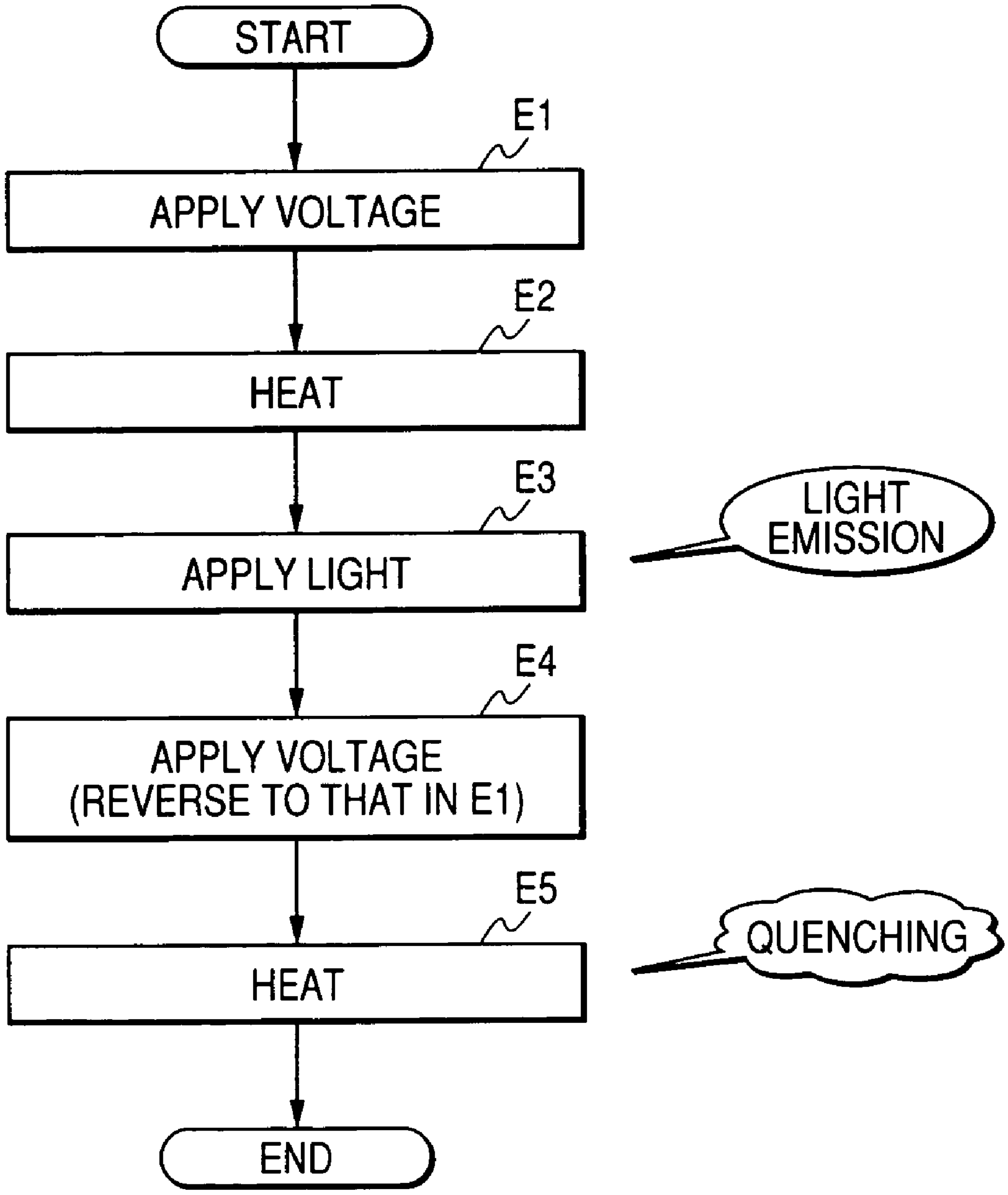
FIG. 12 is a flow chart of operation of the light-emitting device according to the fifth exemplary embodiment of the invention.

An example of operation of the light-emitting device will be described below with reference to FIG. 12. FIG. 12 is a flow chart showing a flow of operation of the light-emitting device 100 according to the fifth exemplary embodiment. FIGS. 2A(a), 2A(b) and FIG. 2B(c) in the first exemplary embodiment can apply to sectional views showing the flow of operation of the light-emitting device 100 in this exemplary embodiment, so that description thereof will be omitted.

First, a voltage from a DC power supply 133 in the same direction as shown in FIG. 2A(a) is applied between the first and second electrodes 122A and 122B but there is little current flowing in the oxygen ion conductor 121 in this condition (step E1 in FIG. 12). Then, the ceramic substrate 141 is heated by the heater element 142 to thereby heat the oxygen ion conductor 121 instantaneously to a temperature suitable for ion conduction (step E2 in FIG. 12). The suitable temperature may be changed in accordance with the constituent material of the oxygen ion conductor 121. For example, in the case where the oxygen ion conductor 121 is made of a zirconia solid electrolyte, oxygen ion conductivity is improved when the oxygen ion conductor 121 is heated at a temperature of not lower than 350° C. In the case where the oxygen ion conductor 121 is made of perovskite $BaCe_{1-x}Gd_xO_3$, oxygen ion conductivity is improved when the oxygen ion conductor 121 is heated at a temperature of not lower than 300° C.

When the oxygen ion conductor 121 is heated instantaneously (e.g., for a certain period in a range of 0.05 to 1.00 seconds) in the aforementioned manner in the condition that a voltage in the same direction as shown in FIG. 2A(a) is applied to the oxygen ion conductor 121 through the first and second electrodes 122A and 122B, a current flows in the plate-like oxygen ion conductor 121. Thus, oxygen ion conduction occurs so that oxygen in the closed space 132 passes through the oxygen ion conductor 121 as oxygen ions $O^{2-}$ and drains out of the light-emitting device 100. When the temperature of the oxygen ion conductor 121 then becomes lower than the suitable temperature, the state of the oxygen ion conductor 121 goes back to a state in which there is little current flowing into the oxygen ion conductor 121. This state is kept even if the voltage is cut off.

When light 134 is then applied to the oxygen-sensitive light-emitting layer 112 to excite a pigment in the oxygen-sensitive light-emitting layer 112 as shown in FIG. 2A(b) in the condition that there is little oxygen in the closed space 132, light emission occurs because there is no excitation energy loss caused by the oxygen quenching effect (step E3 in FIG. 12).

A voltage in a direction opposite to that in the step E1 is then applied between the first and second electrodes 122A and 122B in the condition that the oxygen-sensitive light-emitting layer 112 is emitting light (step E4 in FIG. 12). Thus, the ceramic substrate 141 is heated instantaneously by the heater element 142 to thereby heat the oxygen ion conductor 121 to a temperature suitable for ion conduction (step E5 in FIG. 12). As a result, a current flows in the oxygen ion conductor 121 to cause oxygen ion conduction, so that oxygen is injected into the closed space 132 to thereby perform quenching due to the oxygen quenching effect as shown in FIG. 2B(c). When the temperature of the oxygen ion conductor 121 then becomes lower than the suitable temperature, the state of the oxygen ion conductor 121 goes back to a state in which there is little current flowing in the oxygen ion conductor 121. This state is kept even if the voltage is cut off.

The step E3 in FIG. 12 may be performed prior to the step E1 in FIG. 12 so that the oxygen concentration in the closed space 132 can be changed after the light-emitting device 100 is irradiated with light 134. Although description has been made on the case where a voltage is applied to the oxygen ion conductor 121 after the oxygen ion conductor 121 is heated, it is a matter of course that a voltage may be applied to the oxygen ion conductor 121 before the oxygen ion conductor 121 is heated. Alternatively, a voltage may be applied to the oxygen ion conductor 121 at the same time that the oxygen ion conductor 121 is heated.

That is, the light-emitting method according to this exemplary embodiment includes the steps of: (first step) making the light-emitting portion 110 emit light by giving light energy to the light-emitting portion 110; and (second step) controlling the intensity of light emitted from the light-emitting portion 110 by changing the oxygen concentration in the surface of the light-emitting portion 110. The second step is performed in such a manner that the oxygen ion conductor 121 is heated to move oxygen through the oxygen ion conductor 121 based on oxygen ion conduction after a voltage is applied to the oxygen ion conductor 121. Start of application of the voltage and start of heating of the oxygen ion conductor 121 may be performed simultaneously. Incidentally, it is a matter of course that the sequence of the first and second steps may be reversed as long as the method can include the first and second steps.

In addition, when the voltage applied to the oxygen ion conductor 121 and the heating time are controlled, the intensity of emitted light can be adjusted easily.

[Sixth Exemplary Embodiment]

(Configuration of Display Apparatus)

Figure 13A:
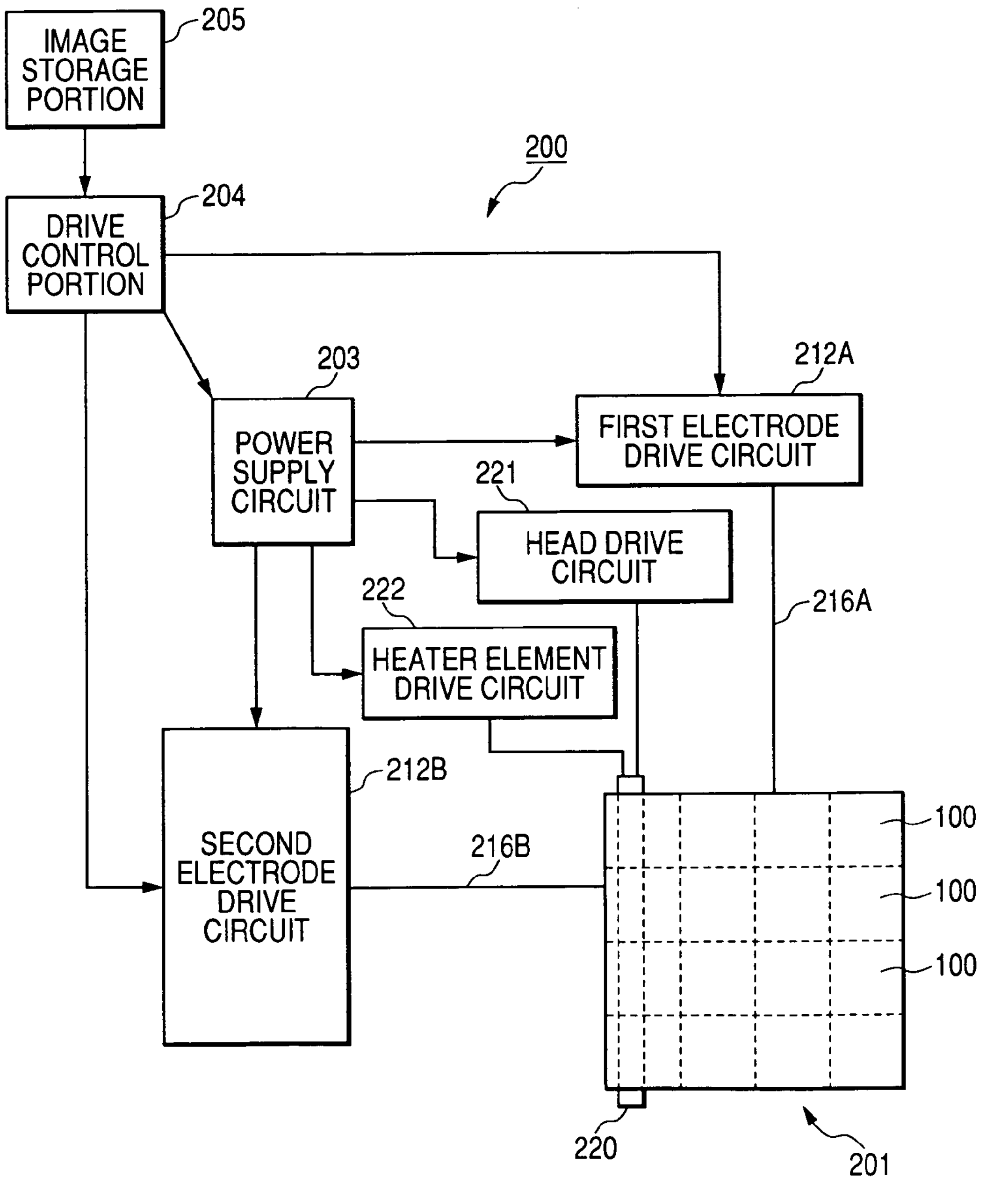
FIG. 13A is a top view showing the configuration of a display apparatus according to a sixth exemplary embodiment of the invention.

FIG. 13A is a top view showing the configuration of a display apparatus according to a sixth exemplary embodiment of the invention.

The display apparatus 200 is schematically configured so that the display apparatus 200 has an image display medium 201, a first electrode drive circuit 212A, a second electrode drive circuit 212B, a thermal head 220, a head drive circuit 221, a heater element drive circuit 222, a drive control portion 204, and a power supply circuit 203. The image display medium 201 includes an array of light-emitting devices 100. Each of the light-emitting devices 100 forms one pixel. The first electrode drive circuit 212A applies a voltage to the light-emitting devices 100 through a first electrode line 216A and a first electrode 122A. The second electrode drive circuit 212B applies a voltage to the light-emitting devices 100 through a second electrode line 216B and a second electrode 122B. The thermal head 220 includes plural heater elements 142 which extend in a column direction of the array of light-emitting devices 100 and which correspond to the rows of light-emitting devices 100 respectively. The head drive circuit 221 drives the thermal head 220 to scan in the row direction of the light-emitting devices 100. The heater element drive circuit 222 controls the quantity of heat from each of the heater elements 142. The drive control portion 204 controls the first electrode drive circuit 212A, the second electrode drive circuit 212B, the head drive circuit 221 and the heater element drive circuit 222 to perform display control on the image display medium 201 based on image data stored in an image storage portion 205. The power supply circuit 203 supplies electric power to the first electrode drive circuit 212A, the second electrode drive circuit 212B, the head drive circuit 221 and the heater element drive circuit 222.

Although FIG. 13A shows the case where the light-emitting devices 100 are arranged in the form of a 4×4 matrix, the shape of the array and the number of the light-emitting devices 100 are not limited thereto. For example, in the same manner as in the second exemplary embodiment, there may be provided a spacer 131*a* having a tetragonal lattice structure as shown in FIG. 4C(a) or a spacer 131*b* having a hexagonal ring structure as shown in FIG. 4C(b). When each of the light-emitting devices 100 is shaped like a polygon such as a regular hexagon, there may be provided a spacer having a honeycomb structure.

Figure 13B:
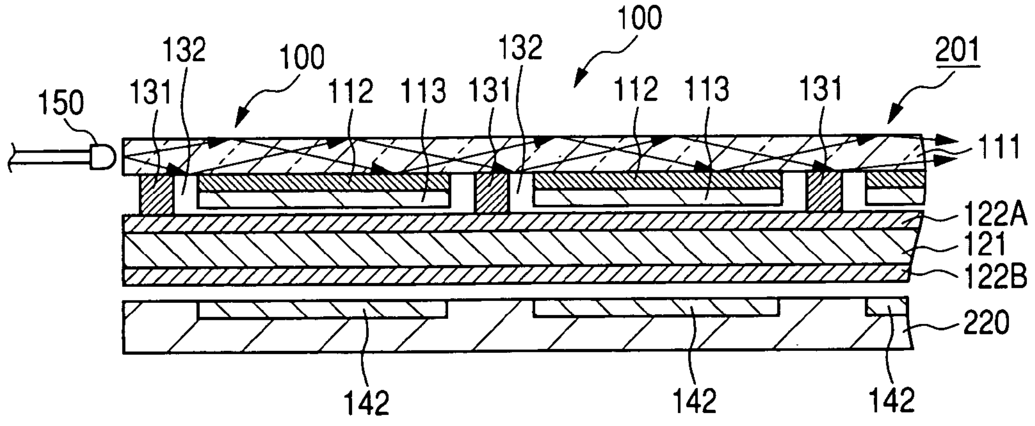
FIG. 13B is a sectional view of an image display medium according to the sixth exemplary embodiment of the invention.

FIG. 13B is a sectional view of the image display medium shown in FIG. 13A. The space in the light-emitting devices 100 is partitioned into closed spaces 132 by a spacer 131, so that the closed spaces 132 are kept airtight. In this exemplary embodiment, each of the first and second electrodes 122A and 122B is shaped like a plate formed continuously all over the whole of a display area corresponding to all the light-emitting devices 100. That is, each of the first and second electrodes 122A and 122B is such a full-surface electrode that a voltage can be applied to oxygen ion conductors 121 as a whole.

As shown in FIG. 13B, the thermal head 220 is disposed to be separate from the second electrode 122B. Each of the heater elements 142 of the thermal head 220 is disposed independently to heat a region of the oxygen ion conductor 121 corresponding to one light-emitting device 100. In this exemplary embodiment, the heater elements 142 are provided on the second electrode 122B side of the head body. In addition, as shown in FIG. 13B, a UV light source 150 is disposed on a side of a transparent substrate 111. The UV light source 150 applies light to the inside of the plate-like transparent substrate 111 in the direction of extension of the transparent substrate 111. The applied light reaches oxygen-sensitive light-emitting layers 112 of all the light-emitting devices 100 while repeatedly reflected on the front and rear surfaces of the transparent substrate 111 as represented by the arrows in FIG. 13B. Incidentally, external light may be introduced into the oxygen-sensitive light-emitting layers 112 without provision of any light source unit such as the UV light source 150.

The drive control portion 204 includes a CPU, an ROM, an RAM, a timing signal generating circuit, etc. The CPU controls the first electrode drive circuit 212A, the second electrode drive circuit 212B, the power supply circuit 203, the head drive circuit 221 and the heater element drive circuit 222 in accordance with a control program stored in the ROM to apply a voltage between the first and second electrodes 122A and 122B and heat the oxygen ion conductors 121 of light-emitting devices 100 corresponding to the pixels based on image data given from the image storage portion 205. Incidentally, the image storage portion 205 may input such image data through a recording medium such as a CD-ROM or a rewritable flash memory or through a network such as an LAN (Local Area Network).

Part or all of the first electrode drive circuit 212A, the second electrode drive circuit 212B, the power supply circuit 203, the head drive circuit 221, the heater element drive circuit 222, the drive control portion 204 and the image storage portion 205 may be provided as external devices which can be connected to the display apparatus 200.

Figure 14:
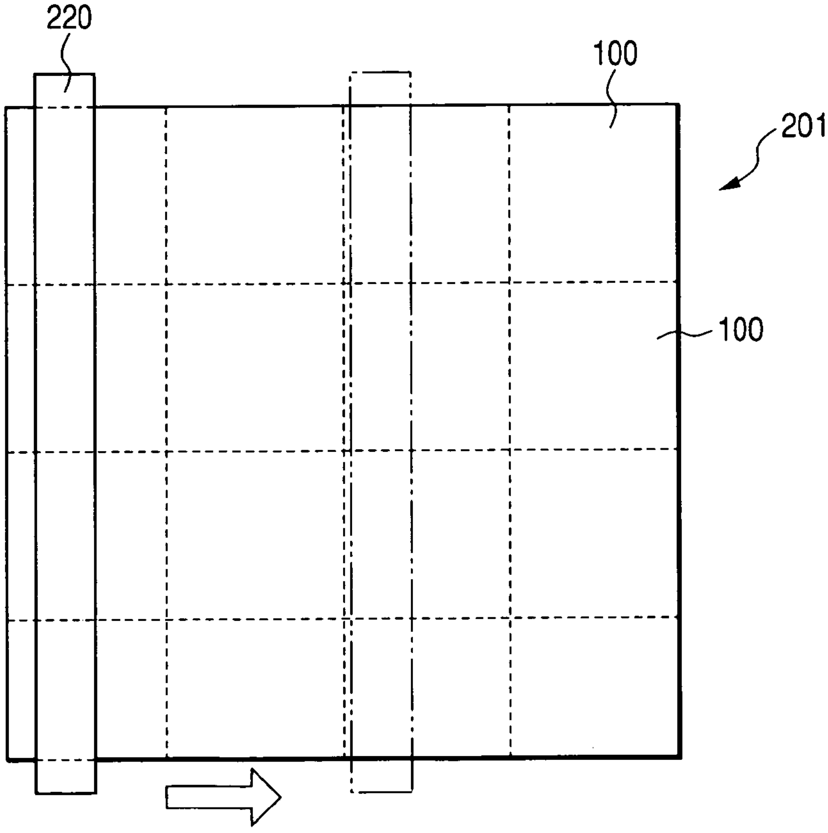
FIG. 14 is a bottom view of the display apparatus showing operation of a thermal head according to the sixth exemplary embodiment of the invention.

The head drive circuit 221 is provided for driving the linear thermal head 220 to scan based on a signal from the drive control portion 204. In addition, the heater element drive circuit 222 heats the respective heater elements 142 based on a signal from the drive control portion 204. Whenever the thermal head 220 moves by one column of light-emitting devices 100, the heater element drive circuit 222 controls the respective heater elements 142 so that the column of light-emitting devices 100 on which the thermal head 220 is located are heated to a suitable temperature. That is, when the thermal head 220 is moved in the row direction as shown in FIG. 14, the light-emitting devices 100 can emit light independently of one another in the whole display area. FIG. 14 is a bottom view of the display apparatus showing the operation of the thermal head 220.

(Operation of Display Apparatus)

Figure 15:
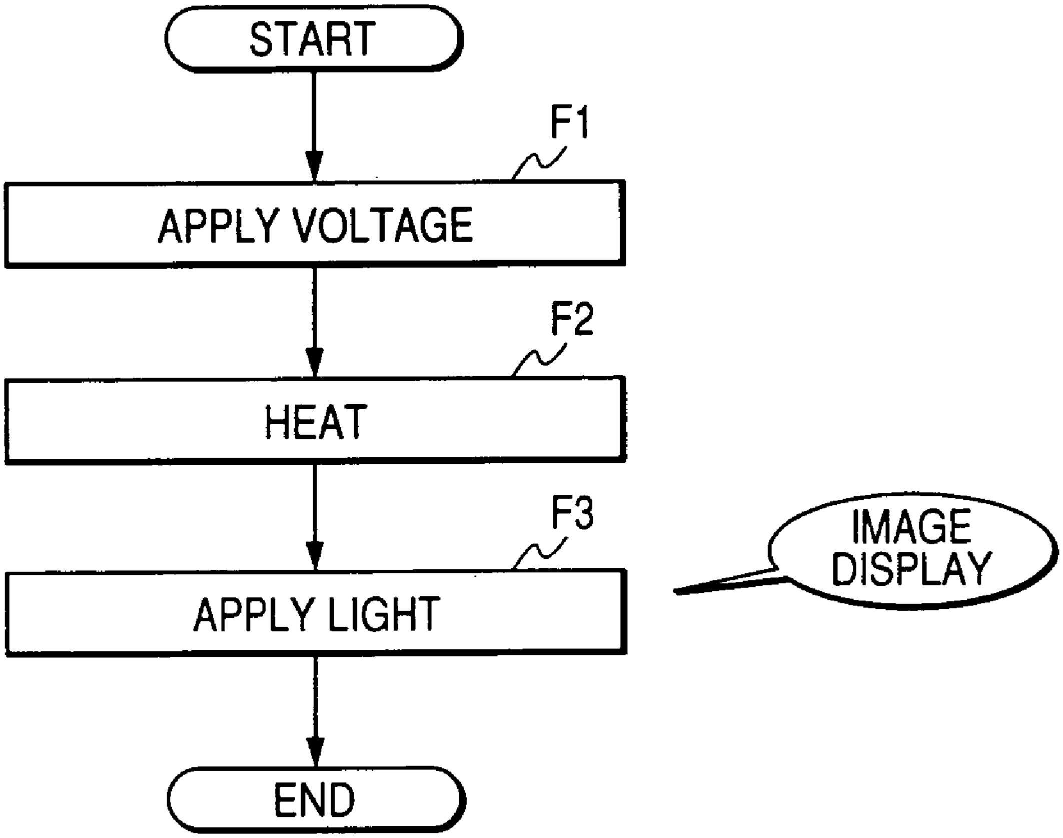
FIG. 15 is a flow chart of operation of the display apparatus according to the sixth exemplary embodiment of the invention.

An example of operation of the display apparatus will be described below with reference to FIG. 15. FIG. 15 is a flow chart showing a flow of operation of the display apparatus 200 according to the sixth exemplary embodiment. Assume that oxygen with a concentration sufficient to cause the oxygen quenching effect in each oxygen-sensitive light-emitting layer 112 is encapsulated in the closed space 132 of each light-emitting device 100 in an initial state.

First, the drive control portion 204 controls the first electrode drive circuit 212A and the second electrode drive circuit 212B to apply a voltage to the oxygen ion conductors 121 corresponding to all the light-emitting devices 100 (step F1 in FIG. 15). In this manner, the oxygen ion conductors 121 are heated to a predetermined temperature, so that oxygen flows out of the closed spaces 132.

Then, the drive control portion 204 controls the head drive circuit 221 and the heater element drive circuit 222 to perform display control on the image display medium 201 based on image data stored in the image storage portion 205 (step F2 in FIG. 15). Specifically, oxygen concentrations in the closed spaces 132 of all the light-emitting devices 100 are controlled based on input image data in such a manner that oxygen ion conductors 121 of light-emitting devices 100 necessary for light emission are heated while oxygen ion conductors 121 of the other light-emitting devices 100 unnecessary for light emission are not heated.

When ultraviolet light from the UV light source 150 is then applied to the inside of the transparent substrate 111, a pigment in the oxygen-sensitive light-emitting layer 112 of each light-emitting device 100 is excited so that light-emitting devices 100 having closed spaces 132 with low oxygen concentrations emit light to thereby bring display of an image on the image display medium 201 based on the input image data (step F3 in FIG. 15).

When the state of each light-emitting device 100 is then restored to an initial state, the image is initialized to be ready for displaying a next image. The initialization is achieved when the drive control portion 204 controls the head drive circuit 221 and the heater element drive circuit 222 to perform writing on all the light-emitting devices 100 in the condition that the drive control portion 204 controls the first electrode drive circuit 212A and the second electrode drive circuit 212B to apply a voltage reverse to that for the previous writing on the oxygen ion conductors 121 corresponding to all the light-emitting devices 100.

Although description has been made on the case where the oxygen ion conductors 121 are heated while a voltage is applied to the oxygen ion conductors 121, it is a matter of course that application of a voltage on the oxygen ion conductors 121 and heating of the oxygen ion conductors 121 may be performed simultaneously.

When the quantity of heat for heating the oxygen ion conductor 121 of each light-emitting device 100 is controlled, an image with gradations can be displayed.

Although the sixth exemplary embodiment has been described on the case where the light-emitting devices 100 in the form of a matrix are controlled so that heating control is performed on the heater elements 142 of the thermal head 220 in the row direction while the thermal head 220 is moved in the column direction, configuration may be made so that either heating or voltage application on the respective light-emitting devices 100 is controlled. This configuration can be made desirably so that light emission of all the light-emitting devices 100 can be controlled.

[Seventh Exemplary Embodiment]

(Configuration of Display Apparatus)

Figure 16A:
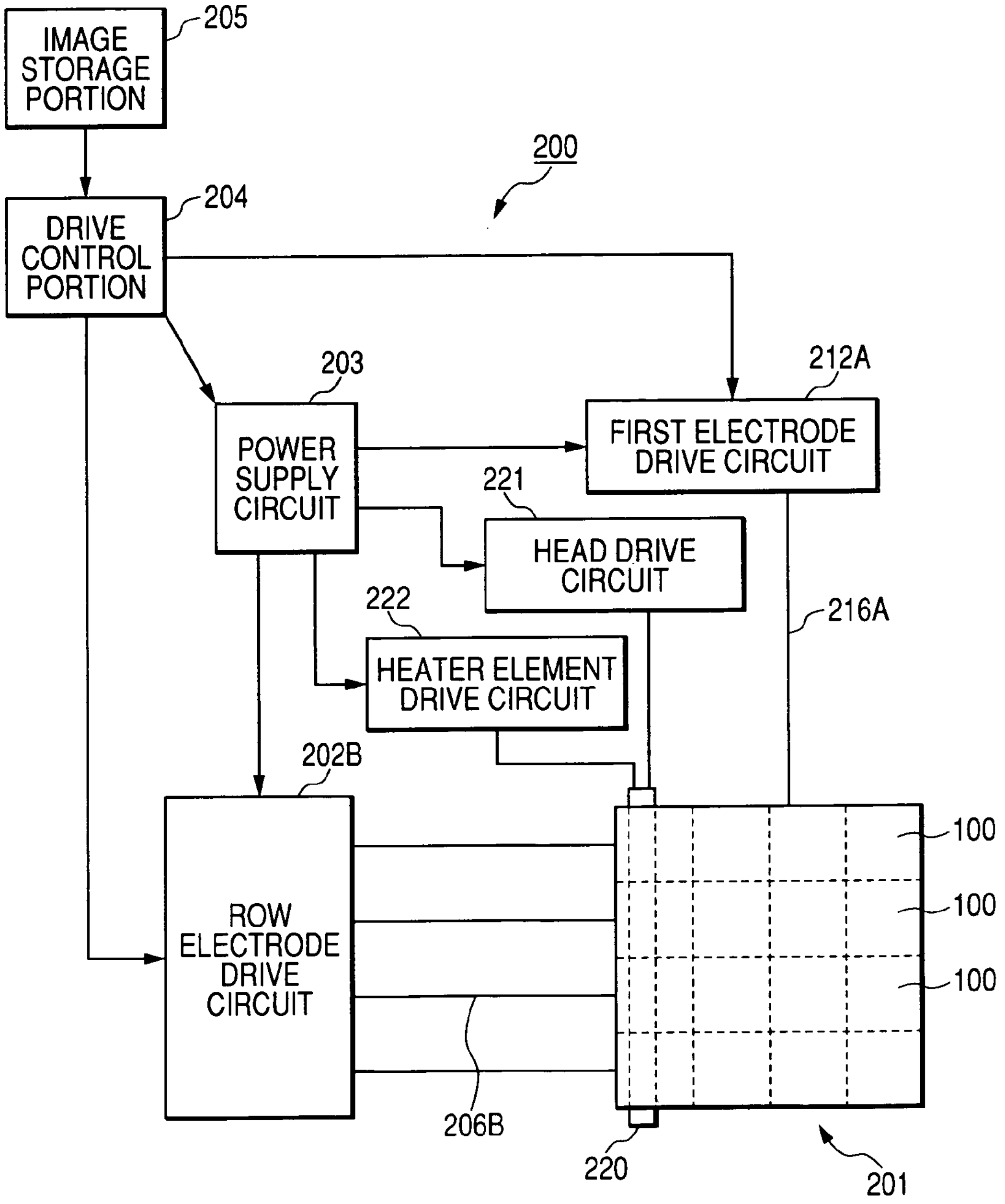
FIG. 16A is a top view showing the configuration of a display apparatus according to a seventh exemplary embodiment of the invention.

FIG. 16A is a top view showing the configuration of a display apparatus according to a seventh exemplary embodiment of the invention.

The display apparatus 200 is schematically configured so that the display apparatus 200 has an image display medium 201, a first electrode drive circuit 212A, a row electrode drive circuit 202B, a thermal head 220, a head drive circuit 221, a heater element drive circuit 222, a drive control portion 204, and a power supply circuit 203. The image display medium 201 includes an array of light-emitting devices 100. Each of the light-emitting devices 100 forms one pixel. The first electrode drive circuit 212A applies a voltage on the light-emitting devices 100 through a first electrode line 216A and a first electrode 122A. The row electrode drive circuit 202B applies a voltage to the light-emitting devices 100 through row electrode lines 206B and second electrodes 122B. The thermal head 220 has a heater element 142 extending in a column direction of the array of light-emitting devices 100 for collectively heating oxygen ion conductors 121 in the same column. The head drive circuit 221 drives the thermal head 220 to scan in the row direction of the light-emitting devices 100. The heater element drive circuit 222 controls the quantity of heat generated from the heater element 142. The drive control portion 204 controls the first electrode drive circuit 212A, the row electrode drive circuit 202B, the head drive circuit 221 and the heater element drive circuit 222 to perform display control on the image display medium 201 based on image data stored in an image storage portion 205. The power supply circuit 203 supplies electric power to the first electrode drive circuit 212A and the row electrode drive circuit 202B.

Although FIG. 16A shows the case where the light-emitting devices 100 are arranged in the form of a 4×4 matrix, the shape of the array and the number of light-emitting devices 100 are not limited thereto. For example, in the same manner as in the second exemplary embodiment, there may be provided a spacer 131*a* having a tetragonal lattice structure as shown in FIG. 4C(a) or a spacer 131*b* having a hexagonal ring structure as shown in FIG. 4C(b). When each of the light-emitting devices 100 is shaped like a polygon such as a regular hexagon, there may be provided a spacer having a honeycomb structure.

Figure 16B:
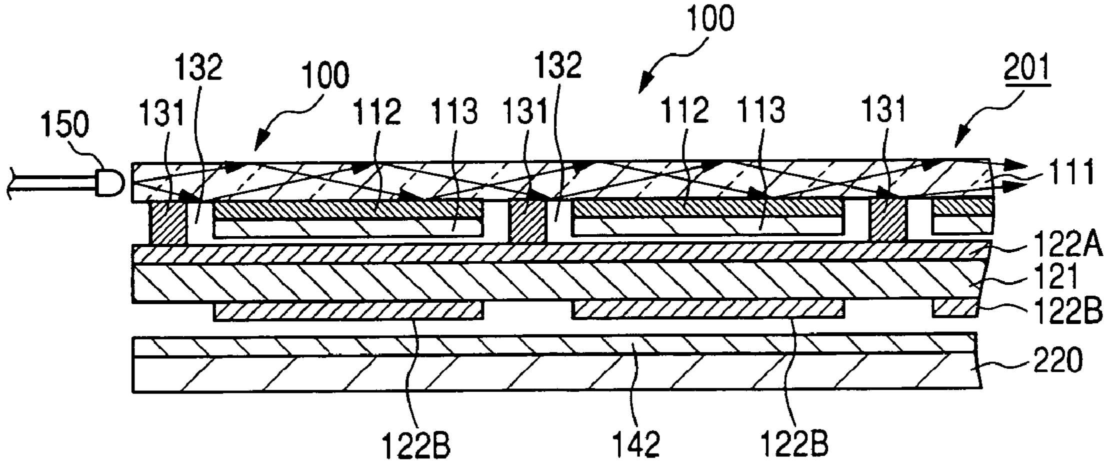
FIG. 16B is a sectional view of an image display medium according to the seventh exemplary embodiment of the invention.

FIG. 16B is a sectional view of the image display medium shown in FIG. 16A. The space in the light-emitting devices 100 is partitioned into closed spaces 132 by a spacer 131, so that the closed spaces 132 are kept airtight. In this exemplary embodiment, the first electrode 122A is a full-surface electrode shaped like a plate formed continuously all over the whole of a display area corresponding to all the light-emitting devices 100. The second electrodes 122B are strip electrodes extending in the row direction. The second electrodes 122B are disposed so as to be perpendicular to the thermal head 220. That is, a voltage is applied to the oxygen ion conductors 121 through the first electrode 122A and the second electrodes 122B so that the oxygen ion conductors 121 extend in the row direction at intervals of a pitch in the column direction because the second electrodes 122B extend in the row direction. As shown in FIG. 16B, a UV light source 150 is disposed on a side of a transparent substrate 111. The UV light source 150 applies light to the inside of the plate-like transparent substrate 111 in the direction of extension of the transparent substrate 111. The applied light reaches oxygen-sensitive light-emitting layers 112 of all the light-emitting devices 100 while repeatedly reflected on the front and rear surfaces of the transparent substrate 111 as represented by the arrows in FIG. 16B. Incidentally, external light may be introduced into the oxygen-sensitive light-emitting layers 112 without provision of any light source unit such as the UV light source 150.

As shown in FIG. 16B, the thermal head 220 is disposed to be separate from the second electrodes 122B. Since the heater element 142 of the thermal head 220 is a line heater extending in the column direction, the oxygen ion conductors 121 can be heated collectively in the column direction. Also in this exemplary embodiment, the heater element 142 is provided on the second electrode 122B side of the head body.

The drive control portion 204 includes a CPU, an ROM, an RAM, a timing signal generating circuit, etc. The CPU controls the first electrode drive circuit 212A, the row electrode drive circuit 202B, the power supply circuit 203, the head drive circuit 221 and the heater element drive circuit 222 in accordance with a control program stored in the ROM to apply a voltage between the first and second electrodes 122A and 122B and heat the oxygen ion conductors 121 of the light-emitting devices 100 corresponding to the pixels based on image data given from the image storage portion 205. Incidentally, the image storage portion 205 may input such image data through a recording medium such as a CD-ROM or a rewritable flash memory or through a network such as an LAN (Local Area Network).

Part or all of the first electrode drive circuit 212A, the row electrode drive circuit 202B, the power supply circuit 203, the head drive circuit 221, the heater element drive circuit 222, the drive control portion 204 and the image storage portion 205 may be provided as external devices which can be connected to the display apparatus 200.

The head drive circuit 221 is provided for driving the linear thermal head 220 to scan based on a signal from the drive control portion 204. In addition, the heater element drive circuit 222 heats the heater element 142 based on a signal from the drive control portion 204. Whenever the thermal head 220 moves by one column of light-emitting devices 100, the heater element drive circuit 222 controls the heater element 142 so that light-emitting devices 100 in the column where the thermal head 220 is located are heated to a suitable temperature. That is, the thermal head 220 can be moved in the row direction so that the light-emitting devices 100 can emit light independently of each other in the whole display area.

(Operation of Display Apparatus)

Figure 17:
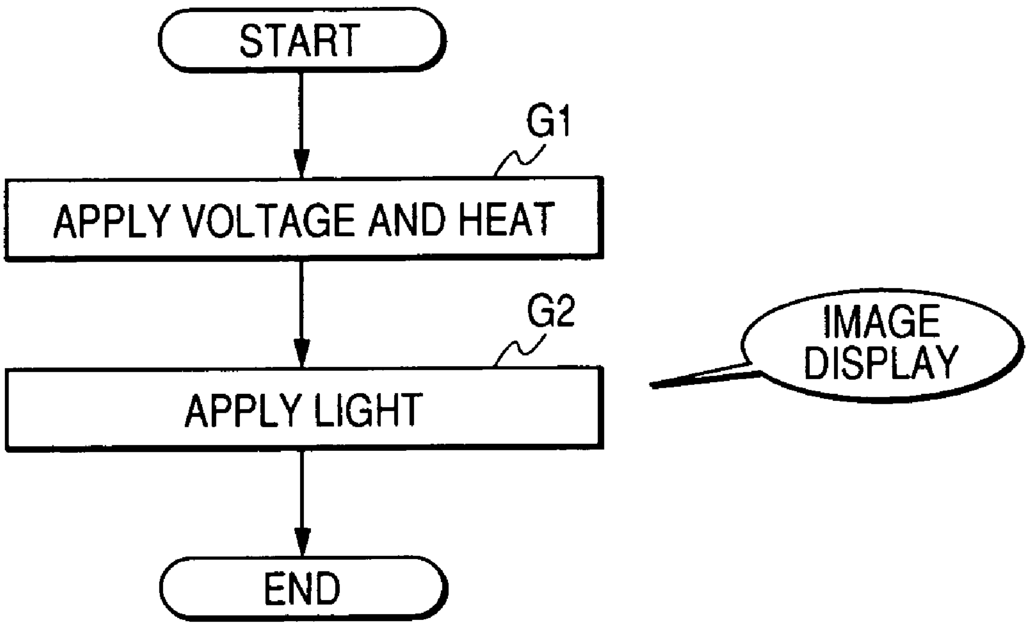
FIG. 17 is a flow chart of operation of the display apparatus according to the seventh exemplary embodiment of the invention.

An example of operation of the display apparatus will be described below with reference to FIG. 17. FIG. 17 is a flow chart showing a flow of operation of the display apparatus 200 according to the seventh exemplary embodiment. Assume that oxygen with a concentration sufficient to cause the oxygen quenching effect in each oxygen-sensitive light-emitting layer 112 is encapsulated in a closed space 132 of each light-emitting device 100 in an initial state.

First, the drive control portion 204 controls the first electrode drive circuit 212A and the row electrode drive circuit 202B to perform voltage application control and controls the head drive circuit 221 and the heater element drive circuit 222 to perform heating control on the basis of image data stored in the image storage portion 205 to thereby perform display control on the image display medium 201 (step G1 in FIG. 17). That is, while a voltage is applied between the first and second electrodes 122A and 122B, the thermal head 220 is controlled to scan so that oxygen concentrations in the closed spaces 132 of all the light-emitting devices 100 are controlled based on a data signal of the input image data.

Specifically, a voltage is applied to oxygen ion conductors 121 of light-emitting devices 100 necessary for light emission while no voltage is applied to oxygen ion conductors 121 of the other light-emitting devices 100 unnecessary for light emission. On this occasion, the heater element 142 may be heated constantly or may be controlled to be heated at the same timing as the control for voltage application.

When ultraviolet light from the UV light source 150 is then applied to the inside of the transparent substrate 111, pigments in the oxygen-sensitive light-emitting layers 112 of the light-emitting devices 100 are excited so that light-emitting devices 100 having closed spaces 132 with low oxygen concentrations emit light. As a result, an image based on the input image data is displayed on the image display medium 201 (step G2 in FIG. 17).

When the state of each light-emitting device 100 is then restored to an initial state, the image is initialized to be ready for displaying a next image. The initialization is achieved when the drive control portion 204 controls the head drive circuit 221 and the heater element drive circuit 222 to perform writing on all the light-emitting devices 100 in the condition that the drive control portion 204 controls the first electrode drive circuit 212A and the row electrode drive circuit 202B to apply a voltage reverse to that for the previous writing to the oxygen ion conductors 121 corresponding to all the light-emitting devices 100.

When the quantity of heat for heating the oxygen ion conductor 121 of each light-emitting device 100 and the voltage applied to the oxygen ion conductor 121 are controlled, an image with gradations can be displayed.

Although the seventh exemplary embodiment has been described on the case where the light-emitting devices 100 in the form of a matrix are configured so that heating control is performed in the column direction by the thermal head 220 while voltage application control is performed in the row direction by the second electrodes 122B which are strip electrodes, light emission of all the light-emitting devices 100 can be controlled as long as either heating or voltage application on all the light-emitting devices 100 can be controlled.

For example, configuration may be made in the same manner as in the fourth exemplary embodiment so that each of first and second electrodes 122A and 122B is shaped like a plate corresponding to all light-emitting devices 100 and a heating portion 140 is provided with heater elements 142 arranged in the form of a matrix corresponding to all the light-emitting devices 100. In this manner, the heater elements 142 can be provided in accordance with pixels (light-emitting devices 100), so that heating control can be performed on all the light-emitting devices 100 simultaneously.

For example, configuration may be made in the same manner as in the third exemplary embodiment so that each of first and second electrodes 122A and 122B is formed as a strip electrode and a heating portion 140 is provided for heating a whole area of an image display medium 201 uniformly. For example, when each of first and second electrodes 122A and 122B is formed as a strip electrode and a thermal head is provided for performing heating in accordance with light-emitting devices 100 in the same manner as in the fourth exemplary embodiment, both voltage application control and heating control can be performed in accordance with the light-emitting devices 100 so that more finer gradation control etc. can be performed. Incidentally, the invention is not limited to the aforementioned embodiments but may be modified variously without departing from the gist of the invention. For example, plural pixels may be provided in one light-emitting device. Plural kinds of oxygen-sensitive light-emitting layers with different emission wavelengths may be used for the purpose of increasing the number of colors to be used in an image.

Hereinafter, specific examples will be described. However, it is noted that the invention is not limited to the specific examples.

EXAMPLE 1

In an example 1, a light-emitting device according to the first exemplary embodiment is manufactured, and then an experiment is conducted in which the manufactured light-emitting device is operated in accordance with the flow charts shown in FIG. 3.

(Formation of Oxygen-Sensitive Light-Emitting Layer) Pressure-Sensitive Paint Functioning as the Oxygen-Sensitive Light-Emitting Layer is Prepared. Platinum Octaethylporphyrinlight Emitting Layer)

Next, a white paint functioning as the light reflecting layer is prepared. Polyvinyl butyral resin (PVB) 1 g is added to and dissolved in ethanol 50 ml. Tiny particles of oxide titanium (particle diameter 50 nm) 15.6 g is added thereto, and the solution is agitated with a paint shaker, to thereby obtain the while paint.

(Manufacturing of Light-Emitting Portion)

Next, the light-emitting portion 110 including the transparent substrate 111, the oxygen-sensitive light-emitting layer 112 and the light reflecting layer 113 is manufactured. At first, a silica glass substrate (10 mm×10 mm×1.2 mm), which functions as the transparent substrate 201, is cleaned with acetone and ethanol, and its outer peripheral portion is masked with a masking tape. The pressure-sensitive paint functioning as the oxygen-sensitive light-emitting layer 202 is uniformly applied onto the glass substrate by a doctor blade so as to have a few of μm to a few tens of μm in thickness. Then, after the pressure-sensitive paint is dried, the while paint functioning as the light reflecting layer 113 is uniformly applied onto the pressure-sensitive paint by a doctor blade so as to have a few of μm to a few tens of μm in thickness. Then, after the white paint is dried, the masking tape is peeled off, and the pressure-sensitive paint and the white paint, which are on the outer peripheral portion of the glass substrate, are removed to thereby obtain the light emitting portion 110. At this time, the pressure-sensitive paint seen through the glass substrate is pink in color.

(Manufacturing of Oxygen Concentration Control Portion)

Next, the oxygen concentration control portion 120 including the oxygen ion conductor 121 and the first and second electrodes 122A and 122B is manufactured. Pt electrodes of 120 nm functioning as the first and second electrodes 122A and 122B are formed on the both surfaces of a flexible zirconia substrate (Ceraflex A manufactured by Japan Fine Ceramics Co., Ltd.: 9 mm×20 mm×0.056 mm) functioning as the oxygen ion conductor 121, by DC sputtering, which uses a metal mask. Thereby, the oxygen concentration control portion 120 is obtained.

(Manufacturing of Light-Emitting Device)

Next, the light-emitting element 100 including the light-emitting portion 110 and the oxygen concentration control portion 120 is manufactured. A spacer 131 made of aluminum foil (0.08 mm in thickness) is fixed by an epoxy adhesive to a region of the light-emitting portion 110 where the pressure-sensitive paint and the while paint on the outer peripheral portion don't exist. Furthermore, the oxygen concentration control portion 120 is fixed by the epoxy adhesive to the spacer 131 from above in a similar manner. The manufactured light-emitting element 100 has the same structure as shown in FIG. 1A.

(Experiment of Operation of Light-Emitting Device) platinum octaethylporphyrinin an example 2, a light-emitting device according to the third exemplary embodiment is manufactured, and then an experiment is conducted in which the manufactured light-emitting device is operated in accordance with the flow chart shown in FIG. 8.

The pressure-sensitive paint prepared in the example 1 is applied to the bottom portion of the test tube 311 having an inner diameter of 5 mm and an outer diameter of 8 mm and dried to obtain the oxygen-sensitive light-emitting layer 312. Then, the white paint prepared in the example 1 is applied onto the oxygen-sensitive light-emitting layer 312 and dried to obtain the light reflecting layer 313.

The opening portion of the test tube 311 is connected to the three-way electromagnetic valve 320 through the pressure-resistant tube 331. The electromagnetic valve 320 is connected to a vacuum pump (not shown) and air. By switching the three-way electromagnetic valve 320, the test tube 311 is switched between a low-pressure state and an atmospheric-pressure state.

Figure 18:
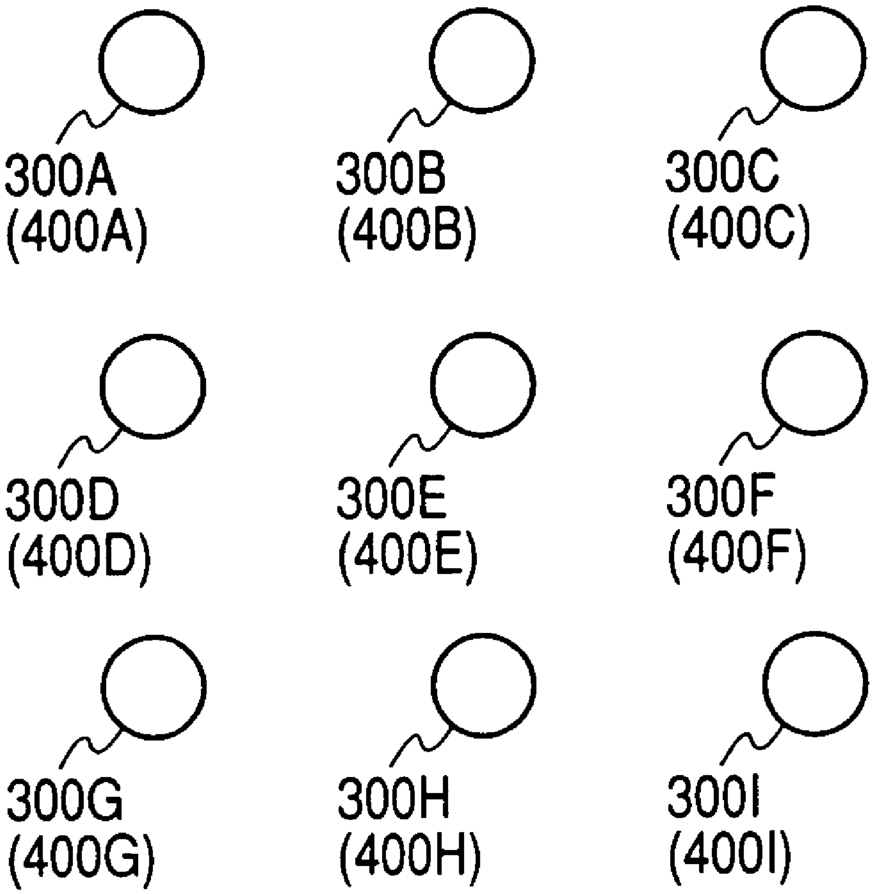
FIG. 18 is a top view of an image display portion according to second and third examples.

Next, nine test tubes 311A to 311I having the same structure are arranged in 3 rows×3 columns so as to form an image display portion as shown in FIG. 18. At step C1 of FIG. 8, five three-way electromagnetic valves (320A, 320C, 320E, 320G and 320I) are switched to the vacuum-pump side so as to discharge oxygen and other gas molecules from the five corresponding test tubes (311A, 311C, 311E, 311G and 311I).

Then, at step C2 of FIG. 8, 320A, 320C, 320E, 320G and 320I, which are connected to the oxygen-sensitive light-emitting layer are switched to the atmospheric-air side In an example 3, a light-emitting device according to the fourth exemplary embodiment is manufactured, and then an experiment is conducted in which the manufactured light-emitting device is operated in accordance with the flow chart shown in FIG. 10.

As in the second example, the pressure-sensitive paint prepared in the example 1 is applied to the bottom portion of the test tube 411 having an inner diameter of 5 mm and an outer diameter of 8 mm and dried to obtain the oxygen-sensitive light-emitting layer 412. Then, the white paint prepared in the example 1 is applied onto the oxygen-sensitive light-emitting layer 412 and dried to obtain the light reflecting layer 413.

An air pipe 414 (Pasteur pipette) is inserted into the opening portion of the test tube 411. The air pipe 414 is connected to a nitrogen cylinder (not shown) through the two-way electromagnetic valve 420. By switching the two-way electromagnetic valve 420, nitrogen can be introduced into the test tube 411 so as to bring the test tube 411 in a oxygen-deficient air state After the introduced nitrogen reaches the oxygen-sensitive light-emitting layer 412, the nitrogen goes along the wall of the test tube 411, and drains out of the test tube 411 through the perforated cap 415. When the introduction of the nitrogen through the electromagnetic valve 420 is stopped, oxygen flows into the test tube 411 through the perforated cap 415, and the concentration inside the test tube 411 becomes to be equal to that of oxygen outside the test tub 411 immediately.

Next, as in the second example, nine test tubes 411A to 411I having the same structure are arranged in 3 rows×3 columns so as to form an image display portion as shown in FIG. 18. At step D1 of FIG. 10, nitrogen is introduced through five two-way electromagnetic valves (420A, 420C, 420E, 420G and 420I) so as to bring the five corresponding test tubes (411A, 411C, 411E, 411G and 411I) into the oxygen-deficient air state.

Then, at step D2 of FIG. 10, 420A, 420C, 420E, 420G and 420I, which are connected to the oxygen-sensitive light-emitting layer are switched to the atmospheric-air side Constituent members in the aforementioned embodiments may be combined arbitrarily without departing from the gist of the invention.

What is claimed is:

1. A light-emitting device comprising:

a light-emitting portion that comprises a surface, the light-emitting portion that emits light with an intensity corresponding to an oxygen concentration on the surface when receiving light energy; and an oxygen concentration control portion that controls the oxygen concentration on the surface of the light-emitting portion, wherein the oxygen concentration control portion comprises:

an oxygen ion conductor; and a pair of electrodes that applies a voltage to the oxygen ion conductor, the application of the voltage supplies a current to the oxygen ion conductor thereby initiating the oxygen concentration control, wherein the light-emitting portion and the oxygen concentration control portion are disposed opposite to each other, and a closed space is formed between the light-emitting portion and the oxygen concentration control portion.

2. The device according to claim 1, wherein the light-emitting portion comprises an oxygen-sensitive light-emitting layer that emits light with the intensity corresponding to the oxygen concentration on the surface of the light-emitting portion.

3. The device according to claim 2, wherein the oxygen-sensitive light-emitting layer comprises pressure-sensitive paint.

4. The device according to claim 1, wherein the oxygen ion conductor comprises a zirconia solid electrolyte.

5. The device according to claim 1, wherein the pair of electrodes comprise Pt.

6. The device according to claim 1, further comprising:

a retention portion disposed between the light emitting portion and the oxygen concentration control portion, wherein:

the retention portion, the light-emitting portion and the oxygen concentration control portion define the closed space.

7. The device according to claim 6, wherein the retention portion is a rib type spacer.

8. The device according to claim 6, wherein the retention portion has a honeycomb structure.

9. The device according to claim 2, wherein the light-emitting portion further comprises a light reflecting layer provided on an oxygen concentration control portion side of the oxygen-sensitive light-emitting layer.

10. The device according to claim 2, further comprising:

a transparent substrate on which the oxygen-sensitive light-emitting layer is formed.

11. The device according to claim 1, wherein the oxygen concentration control portion further comprises a heating portion that heats the oxygen ion conductor.

12. The device according to claim 11, wherein the heating portion comprises a ceramic heater.

13. A display apparatus comprising:

a transparent substrate;

an oxygen-sensitive light-emitting layer formed on the transparent substrate;

an oxygen ion conductor disposed opposite to the oxygen-sensitive light-emitting layer;

first and second electrodes between which the oxygen ion conductor is disposed and that apply a voltage to the oxygen ion conductor, wherein the application of the voltage supplies a current to the oxygen ion conductor thereby initiating oxygen concentration control;

a partition member that partitions and seals space between the transparent substrate and the oxygen ion conductor; and a heating portion that heats the oxygen ion conductor.

14. The apparatus according to claim 13, wherein:

the oxygen ion conductor comprises first and second surfaces;

the first electrode covers the entire first surface of the oxygen ion conductor;

the second electrode covers the entire second surface of the oxygen ion conductor; and the heating portion comprises a thermal head.

15. The apparatus according to claim 13, wherein:

the oxygen ion conductor comprises first and second surfaces;

the first electrode covers the entire first surface of the oxygen ion conductor;

the second electrode comprises a plurality of strip electrodes;

the heater comprises a straight heater.

* * * * *